(12) United States Patent
Li et al.

(10) Patent No.: US 12,191,430 B2
(45) Date of Patent: Jan. 7, 2025

(54) LIGHT-EMITTING SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventors: Shipei Li, Beijing (CN); Wusheng Li, Beijing (CN); Ying Zhao, Beijing (CN); Huili Wu, Beijing (CN); Sheng Xu, Beijing (CN); Wei He, Beijing (CN); Renquan Gu, Beijing (CN); Wenqing Xue, Beijing (CN); Jianjun Zhao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/043,203

(22) PCT Filed: Mar. 31, 2022

(86) PCT No.: PCT/CN2022/084421
§ 371 (c)(1),
(2) Date: Feb. 27, 2023

(87) PCT Pub. No.: WO2023/184342
PCT Pub. Date: Oct. 5, 2023

(65) Prior Publication Data
US 2024/0282894 A1 Aug. 22, 2024

(51) Int. Cl.
*H01L 33/58* (2010.01)
*G02F 1/1335* (2006.01)
(Continued)

(52) U.S. Cl.
CPC ........ *H01L 33/58* (2013.01); *G02F 1/133603* (2013.01); *G02F 1/133608* (2013.01);
(Continued)

(58) Field of Classification Search
CPC ..... H01L 33/58; H01L 25/0753; H01L 33/62; G02F 1/133612; G02F 1/133603; G02F 1/133608
See application file for complete search history.

(56) References Cited

U.S. PATENT DOCUMENTS

| 2003/0214227 A1 | 11/2003 | Tsuchiya |
| 2006/0139254 A1 | 6/2006 | Hayakawa et al. |

(Continued)

FOREIGN PATENT DOCUMENTS

| CN | 1866105 A | 11/2006 |
| CN | 105717688 A | 6/2016 |

(Continued)

OTHER PUBLICATIONS

U.S. Non-Final Office Action for corresponding U.S. Appl. No. 17/631,594, dated Apr. 17, 2023, 10 pages.
(Continued)

*Primary Examiner* — Mary Ellen Bowman
(74) *Attorney, Agent, or Firm* — Dority & Manning, P.A.

(57) ABSTRACT

A light-emitting substrate includes a transparent substrate; a first metal light-shielding layer, a wiring layer and light-emitting devices. The first metal light-shielding layer is disposed on the transparent substrate. The wiring layer is disposed on a side of the first metal light-shielding layer away from the transparent substrate, and the wiring layer includes circuit traces and pads. Orthographic projections of the circuit traces and the pads on the transparent substrate are all located within an orthographic projection of the first metal light-shielding layer on the transparent substrate. The (Continued)

light-emitting devices are disposed on a side of the wiring layer away from the transparent substrate, and electrically connected to some of the pads; and orthographic projections of the light-emitting devices on the transparent substrate are located within the orthographic projection of the first metal light-shielding layer on the transparent substrate.

20 Claims, 14 Drawing Sheets

(51) Int. Cl.
  *G02F 1/13357* (2006.01)
  *H01L 25/075* (2006.01)
  *H01L 33/62* (2010.01)
(52) U.S. Cl.
  CPC .... *G02F 1/133612* (2021.01); *H01L 25/0753* (2013.01); *H01L 33/62* (2013.01); *G02F 2203/02* (2013.01); *H01L 2933/0058* (2013.01); *H01L 2933/0066* (2013.01)

(56) References Cited

U.S. PATENT DOCUMENTS

| | | | |
|---|---|---|---|
| 2006/0261337 | A1 | 11/2006 | Koma |
| 2007/0046603 | A1 | 3/2007 | Smith et al. |
| 2010/0226120 | A1 | 9/2010 | Koma et al. |
| 2015/0029238 | A1 | 1/2015 | Kanda et al. |
| 2016/0049615 | A1 | 2/2016 | Kim et al. |
| 2017/0082887 | A1* | 3/2017 | Kubota ............ G02F 1/133345 |
| 2017/0293171 | A1* | 10/2017 | Yamazaki ............ H10K 59/50 |
| 2021/0098665 | A1* | 4/2021 | Itou ................. H01L 27/1255 |
| 2021/0223440 | A1 | 7/2021 | Wang et al. |
| 2022/0344613 | A1 | 10/2022 | Liu |

FOREIGN PATENT DOCUMENTS

| | | |
|---|---|---|
| CN | 105929595 A | 9/2016 |
| CN | 110782806 A | 2/2020 |
| CN | 210376949 U | 4/2020 |
| CN | 111863862 A | 10/2020 |
| CN | 212809165 U | 3/2021 |
| CN | 113036057 A | 6/2021 |
| CN | 113345879 A | 9/2021 |
| CN | 113519061 A | 10/2021 |
| CN | 114171661 A | 3/2022 |
| JP | 2007041536 A | 2/2007 |
| JP | 2010232268 A | 10/2010 |
| WO | WO2017055374 A1 | 4/2017 |

OTHER PUBLICATIONS

U.S. Notice of Allowance for corresponding U.S. Appl. No. 17/631,594, dated Jul. 7, 2023, 7 pages.
PCT International Search Report and Written Opinion for corresponding PCT Application No. PCT/CN2021/079090, mailed Dec. 14, 2021, 10 pages.
PCT International Search Report and Written Opinion for corresponding PCT Application No. PCT/CN2022/084421, mailed Dec. 15, 2022, 8 pages.

* cited by examiner

LIGHT-EMITTING SUBSTRATE AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2022/084421 filed on Mar. 31, 2022, which is incorporated herein by reference in its entirety.

TECHNICAL FIELD

The present disclosure relates to the field of display technology, and in particular, to a light-emitting substrate and a method for manufacturing the same, and a display apparatus.

BACKGROUND

Reflective liquid crystal display (RLCD) apparatus is widely used in smart products such as wearable devices, electronic tags, electronic books and the like due to the advantages of energy saving, eye protection and the like. When ambient light is strong, the RLCD apparatus can directly reflect external light to realize black and white display; when the ambient light is weak, a light-exit side of a display panel in the RLCD apparatus may be provided with a light source, and the display effect of the RLCD apparatus can be improved by means of the light source. The light source may be a light source having light-emitting diodes (LEDs) on the order of sub-millimeter or even microns.

SUMMARY

In an aspect, a light-emitting substrate is provided. The light-emitting substrate includes a transparent substrate, a first metal light-shielding layer, a wiring layer and light-emitting devices. The first metal light-shielding layer is disposed on the transparent substrate. The wiring layer is disposed on a side of the first metal light-shielding layer away from the transparent substrate, and the wiring layer includes circuit traces and pads; and orthographic projections of the circuit traces and the pads on the transparent substrate are all located within an orthographic projection of the first metal light-shielding layer on the transparent substrate. The light-emitting devices are disposed on a side of the wiring layer away from the transparent substrate and are electrically connected to some of the pads; and orthographic projections of the light-emitting devices on the transparent substrate are located within the orthographic projection of the first metal light-shielding layer on the transparent substrate.

In some embodiments, the light-emitting substrate further includes a second metal light-shielding layer. The second metal light-shielding layer is disposed between the first metal light-shielding layer and the wiring layer. The second metal light-shielding layer and the first metal light-shielding layer are configured in such way that at least part of ambient light reflected by a surface of the second metal light-shielding layer proximate to the transparent substrate and at least part of the ambient light reflected by a surface of the first metal light-shielding layer proximate to the transparent substrate are capable of interfering destructively with each other.

In some embodiments, a thickness of the second metal light-shielding layer is in a range of 100 angstroms to 500 angstroms, inclusive; and/or a material of the second metal light-shielding layer includes molybdenum oxide and/or molybdenum niobium oxide.

In some embodiments, a thickness of the first metal light-shielding layer is in a range of 400 angstroms to 500 angstroms, inclusive; and/or a material of the first metal light-shielding layer includes molybdenum oxide and/or molybdenum niobium oxide.

In some embodiments, a distance between a border of the orthographic projection of the first metal light-shielding layer on the transparent substrate and a border, at a same side, of an orthographic projection of a light-emitting device of the light-emitting devices on the transparent substrate is greater than or equal to $W_1$, and $$W_1 = H_1 \times \tan\theta;$$

where $H_1$ is a maximum perpendicular distance between a surface of the light-emitting device away from the transparent substrate and a surface of the transparent substrate away from the light-emitting device; and $\theta$ is a total reflection angle of the surface of the transparent substrate away from the light-emitting device.

In some embodiments, the orthographic projections of the light-emitting devices on the transparent substrate each are a first projection pattern; the first metal light-shielding layer includes set light-shielding patterns each for shielding a light-emitting device, and an orthographic projection of the set light-shielding pattern on the transparent substrate is a second projection pattern. A distance between a border of the first projection pattern and a border of the second projection pattern at a same side is greater than or equal to $W_2$, and $$W_2 = H_2 \times \tan\theta;$$

where the border of the first projection pattern is a first border, and the border of the second projection pattern at the same side is a second border; $H_2$ is a maximum perpendicular distance between a side edge, corresponding to the first border, of a surface of the light-emitting device away from the transparent substrate and a surface of the transparent substrate away from the light-emitting device; and $\theta$ is a total reflection angle of the surface of the transparent substrate away from the light-emitting device.

In some embodiments, a distance between a border of the orthographic projection of the first metal light-shielding layer on the transparent substrate and a border, at a same side, of an orthographic projection of a light-emitting device of the light-emitting devices on the transparent substrate is greater than or equal to 4.2 μm; and/or a distance between a border of an orthographic projection of a circuit trace of the circuit traces on the transparent substrate and the border, at the same side, of the orthographic projection of the first metal light-shielding layer on the transparent substrate is greater than or equal to 0.5 μm.

In some embodiments, the wiring layer further includes a support layer, the support layer includes a plurality of support patterns, each of the support patterns includes two support portions, each of the support portions has a first side surface, the first side surface is a side surface in a direction in which the support portions are arranged, and the first side surface is obliquely disposed relative to a reference surface; the reference surface is a plane where a surface of the transparent substrate away from the light-emitting devices is located. The some of the pads in the wiring layer includes anode pads and cathode pads, the light-emitting devices each include an anode pin and a cathode pin, the anode pin is electrically connected with an anode pad of the anode pads, the cathode pin is electrically connected with a cathode pad of the cathode pads, and the anode pad and the cathode pad are respectively located on first side surfaces of two support portions of a corresponding support pattern.

In some embodiments, the support portions each have a shape of a pyramid, and/or the first side surfaces of the two support portions are substantially parallel; and/or thicknesses of the two support portions are substantially equal.

In some embodiments, the light-emitting devices each further include a light-emitting portion, and the anode pin and the cathode pin are located on a same side of the light-emitting portion; in a thickness direction of the light-emitting portion, a thickness of the anode pin is greater than a thickness of the cathode pin. An end surface of the anode pin away from the light-emitting portion is in surface contact with the anode pad, and an end surface of the cathode pin away from the light-emitting portion is in surface contact with the cathode pad.

In some embodiments, a surface of the light-emitting portion away from the anode pin and the cathode pin is obliquely disposed relative to the reference surface.

In some embodiments, an angle included between the first side surface and the reference surface is α, and $$\alpha = \arctan(L/S);$$

where L is a difference between a thickness of the anode pin and a thickness of the cathode pin; and S is a dimension of the cathode pin in a first direction, and the first direction is a direction from the anode pin to the cathode pin.

In some embodiments, an angle included between the first side surface and the reference surface is in a range of 8 degrees to 12 degrees, inclusive.

In some embodiments, the circuit traces include signal lines and transfer lines. The wiring layer further includes a first conductive layer, a first passivation layer, a second conductive layer, and a second passivation layer. The first conductive layer is disposed between the support layer and the transparent substrate; and the signal lines are located in the first conductive layer. The first passivation layer is disposed between the first conductive layer and the support layer. The second conductive layer is disposed on a side of the support layer away from the transparent substrate; and the transfer lines and the pads are located in the second conductive layer. The second passivation layer is disposed on a side of the second conductive layer away from the transparent substrate; and the second passivation layer has a plurality of openings, and the second conductive layer has a portion located on the first side surface of the support portion, at least part of the portion is exposed by an opening of the plurality of openings, and the at least part of the portion serves as a pad of the pads.

In some embodiments, the wiring layer further includes a third passivation layer and a fourth passivation layer. The third passivation layer is disposed between the second conductive layer and the support layer, and the fourth passivation layer is disposed between the first conductive layer and the first metal light-shielding layer.

In some embodiments, the light-emitting substrate further includes fixing components, and the fixing components are disposed on a side of the pads away from the transparent substrate; and the fixing components are configured to connect pins of the light-emitting devices with the some of the pads.

In some embodiments, a material of the fixing components includes resin.

In another aspect, a method for manufacturing a light-emitting substrate is provided. The manufacturing method includes: forming a first metal light-shielding layer on a transparent substrate; forming a wiring layer on a side of the first metal light-shielding layer away from the transparent substrate, the wiring layer including circuit traces and pads, and orthographic projections of the circuit traces and the pads on the transparent substrate being all located within an orthographic projection of the first metal light-shielding layer on the transparent substrate; and arranging light-emitting devices on a side of the wiring layer away from the transparent substrate, the light-emitting devices being electrically connected to some of the pads; orthographic projections of the light-emitting devices on the transparent substrate being located within the orthographic projection of the first metal light-shielding layer on the transparent substrate.

In some embodiments, between forming the first metal light-shielding layer on the transparent substrate and forming the wiring layer on the side of the first metal light-shielding layer away from the transparent substrate, the manufacturing method further includes: forming a second metal light-shielding layer on the side of the first metal light-shielding layer away from the transparent substrate. The second metal light-shielding layer and the first metal light-shielding layer are configured in such way that at least part of ambient light reflected by a surface of the second metal light-shielding layer proximate to the transparent substrate and at least part of the ambient light reflected by a surface of the first metal light-shielding layer proximate to the transparent substrate are capable of interfering destructively with each other.

In some embodiments, the circuit traces include signal lines and transfer lines; and forming the wiring layer on the side of the first metal light-shielding layer away from the transparent substrate includes: forming a first conductive layer on the side of the first metal light-shielding layer away from the transparent substrate, the signal lines being located in the first conductive layer; forming a first passivation layer on a side of the first conductive layer away from the transparent substrate; forming a support layer on a side of the first passivation layer away from the transparent substrate, the support layer including a plurality of support patterns; each of the plurality of support patterns including two support portions, each of the support portions having a first side surface, and the first side surface being obliquely disposed relative to a reference surface; the reference surface being a plane where a surface of the transparent substrate away from the light-emitting devices is located; and forming a second conductive layer on a side of the support layer away from the transparent substrate, the transfer lines and the pads being located in the second conductive layer.

In some embodiments, forming the support layer on the side of the first passivation layer away from the transparent substrate includes: forming a support film on the side of the first passivation layer away from the transparent substrate; patterning the support film to obtain a plurality of initial support patterns, each of the initial support patterns including two initial support portions, each of the initial support portions having an initial first side surface, and the initial first side surface being a side surface in a direction in which the two initial support portions are arranged; performing a mask exposure and a development on the initial support portion multiple times to form a multi-stage step in the initial first side surface of the initial support portion; and heating and curing the initial support portion to form the support portion, the initial first side surface forming the first side surface of the support portion.

In some embodiments, arranging the light-emitting devices on the side of the wiring layer away from the transparent substrate includes: forming a resin layer on the pads; placing pins of the light-emitting devices on the resin layer; heating the resin layer to melt the resin layer; and curing the resin layer after the pins of the light-emitting devices are electrically connected to the some of the pads.

In yet another aspect, a display apparatus is provided. The display apparatus includes a display panel and the light-emitting substrate according to any of the above embodiments. The display panel has a light-exit side and a non-light-exit side which are opposite to each other. The display panel includes a reflective layer disposed on the non-light-exit side, and the reflective layer is capable of reflecting light from the light-exit side. The light-emitting substrate is disposed on the light-exit side of the display panel.

BRIEF DESCRIPTION OF THE DRAWINGS

In order to more clearly illustrate the technical solutions in the present disclosure, the accompanying drawings used in some embodiments of the present disclosure will be briefly introduced below. Obviously, the accompanying drawings to be described below are merely accompanying drawings of some embodiments of the present disclosure, and a person having ordinary skill in the art can obtain other drawings according to these accompanying drawings. In addition, the accompanying drawings to be described below may be regarded as schematic diagrams, but are not limitations on actual sizes of products, actual processes of methods, and actual timings of signals involved in the embodiments of the present disclosure.

DETAILED DESCRIPTION

Figure 1:
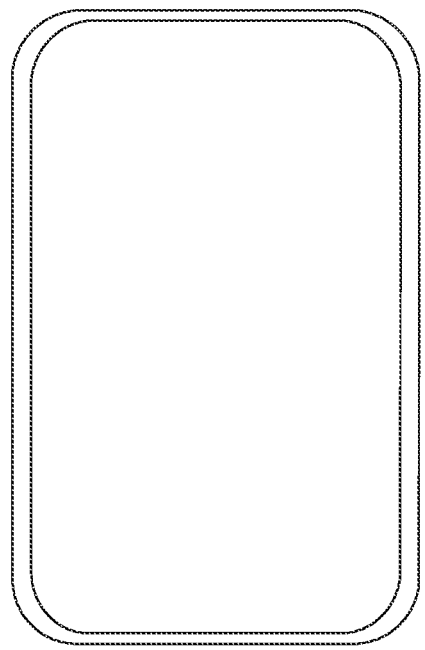
FIG. 1 is a structural diagram of a display apparatus, in accordance with some embodiments.

Technical solutions in some embodiments of the present disclosure will be clearly and completely described below with reference to the accompanying drawings. Obviously, the described embodiments are merely some embodiments of the present disclosure rather than all embodiments. All other embodiments obtained by a person having ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. The schematic representation of the above terms does not necessarily refer to the same embodiment(s) or example(s). In addition, specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, features defined with the terms such as "first" and "second" may explicitly or implicitly include one or more of the features. In the description of the embodiments of the present disclosure, the term "multiple," "a plurality of" or "the plurality of" means two or more unless otherwise specified.

In the description of some embodiments, the terms "connected" and "electrically connected" and their derivatives may be used. For example, the term "connected" may be used when describing some embodiments to indicate that two or more components are in direct physical or electrical contact with each other. The embodiments disclosed herein are not necessarily limited to the content herein. For another example, the term "electrically connected" may be used in the description of some embodiments to indicate that two or more components are in direct electrical contact or indirect electrical connection with one another. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "applicable to" or "configured to" herein is meant an open and inclusive expression, which does not exclude devices that are applicable to or configured to perform additional tasks or steps.

In addition, the use of the phase "based on" means openness and inclusiveness, since a process, step, calculation or other action that is "based on" one or more of the stated conditions or values may, in practice, be based on additional conditions or values exceeding those stated.

As used herein, the terms "parallel", "perpendicular" and "equal" each include the stated situation as well as the situation similar to the stated situation. A range of the similar condition is within an acceptable deviation range, where the acceptable deviation range is determined by a person of ordinary skill in the art, considering measurement in question and errors associated with measurement of a particular quantity (i.e., limitations of a measurement system). For example, the term "parallel" includes absolute parallelism and approximate parallelism, where an acceptable range of deviation of the approximate parallelism may be, for example, a deviation within 5 degrees; the term "perpendicular" includes absolute perpendicularity and approximate perpendicularity, where an acceptable range of deviation of the approximate perpendicularity may also be, for example, a deviation within 5 degrees. The term "equal" includes absolute equality and approximate equality, where an acceptable range of deviation of the approximate equality may be, for example, a difference between two equals of less than or equal to 5% of either of the two equals.

It will be understood that when a layer or element is referred to as being on another layer or substrate, it may be that the layer or element is directly on the another layer or substrate, or intervening layer(s) may also be present between the layer or element and the another layer or substrate.

Exemplary embodiments are described herein with reference to sectional views and/or plan views as idealized exemplary drawings. In the accompanying drawings, thickness of layers and regions may be exaggerated for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Referring to FIG. 1, some embodiments of the present disclosure provide a display apparatus 1000, which may be any apparatus that can display images whether in motion (e.g., videos) or stationary (e.g., still images) and whether text or images. Exemplarily, the display apparatus 1000 may be any product or component having a display function such as a television, a notebook computer, a tablet computer, a mobile phone, a personal digital assistant (PDA), a navigator, a wearable device, a virtual reality (VR) device, or the like.

Figure 2:
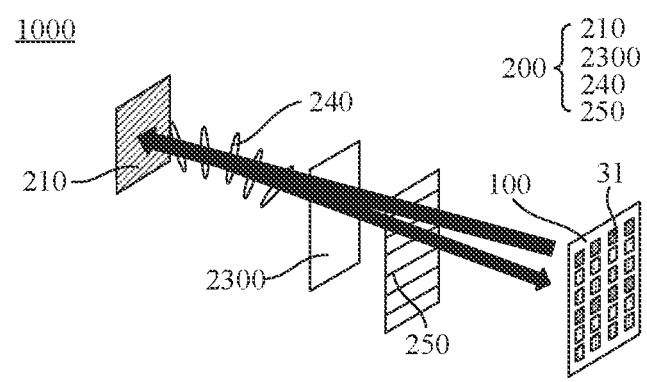
FIG. 2 is an exploded view of a display apparatus, in accordance with some embodiments.
Figure 3:
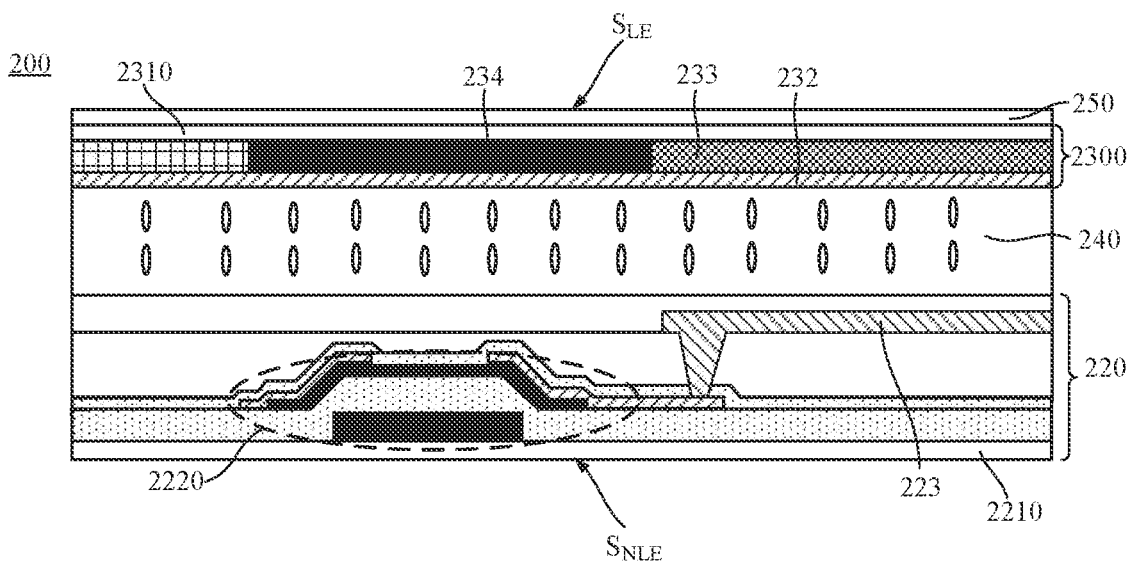
FIG. 3 is a sectional view of a display panel, in accordance with some embodiments.

In some embodiments, the display apparatus 1000 may be a liquid crystal display (LCD) apparatus. Referring to FIG. 2 and FIG. 3, the display apparatus 1000 may include a light-emitting substrate 100 and a display panel 200. The display panel 200 has a light-exit side $S_{LE}$ and a non-light-exit side $S_{NLE}$ which are opposite to each other. The light-exit side $S_{LE}$ refers to one side of the display panel 200 for displaying images (the upper side of the display panel 200 in FIG. 3), and the non-light-exit side $S_{NLE}$ refers to the other side opposite to the light-exit side $S_{LE}$. The light-emitting substrate 100 is disposed on the light-exit side of the display panel 200.

Referring to FIG. 2, the display panel 200 is a reflective display panel. Exemplarily, the display panel 200 includes a reflective layer 210 disposed on the non-light-exit side, and the reflective layer 210 can reflect light from the light-exit side. For example, the display panel 200 is a reflective liquid crystal display panel.

The following embodiments of the present disclosure are described by taking an example in which the display substrate 200 is the reflective liquid crystal display panel, and the example does not limit the embodiments of the present disclosure.

As shown in FIG. 3, the display panel 200 includes an array substrate 220, an opposite substrate 2300, and a liquid crystal layer 240 disposed between the array substrate 220 and the opposite substrate 2300.

Each sub-pixel of the array substrate 220 is provided with a thin film transistor (TFT for short) 2220 and a reflective electrode (pixel electrode) 223 located on a first substrate 2210. The thin film transistor 2220 includes an active layer, a source electrode, a drain electrode, a gate electrode and a gate insulating layer, the source electrode and the drain electrode are both in contact with the active layer, and the pixel electrode 223 is electrically connected to the drain electrode of the thin film transistor 2220.

It can be noted that, referring to FIG. 2 and FIG. 3, the reflective electrode 223 shown in FIG. 3 may serve as the reflective layer 210 of the display panel 200 in FIG. 2.

In some embodiments, as shown in FIG. 3, the opposite substrate 2300 may include a common electrode 232 disposed on the second substrate 2310.

In some embodiments, as shown in FIG. 3, the opposite substrate 2300 may further include a color filter layer 233 disposed on the second substrate 2310. In this case, the opposite substrate 2300 may also be referred to as a color filter (CF) substrate. The color filter layer 233 includes at least red photoresist units, green photoresist units and blue photoresist units, and the red photoresist units, the green photoresist units and the blue photoresist units are opposite to the sub-pixels in the array substrate 220 in a one-to-one correspondence. The opposite substrate 2300 further includes a black matrix pattern 234 disposed on the second substrate 2310, and the black matrix pattern 234 is used for separating the red photoresist units, the green photoresist units, and the blue photoresist units.

In some embodiments, as shown in FIG. 3, the display panel 200 further includes a polarizer 250 disposed on the side of the opposite substrate 2300 away from the array substrate 220.

It can be understood that, when ambient light is strong, referring to FIG. 2, the light-emitting substrate 100 may not emit light, and the display panel 200 displays images by using the ambient light. In this case, the reflective electrode 223 of the display panel 200 reflects the ambient light from the light-exit side of the display panel 200 to realize black and white display or color display, thereby achieving the effect of saving energy and protecting eyes.

When the ambient light is weak, referring to FIG. 2, the light-emitting substrate 100 emits light to increase the amount of light from the light-exit side of the display panel 200. In this case, the reflective electrode 223 of the display panel 200 reflects the light emitted by the light-emitting substrate 100 and the ambient light from the light-exit side of the display panel 200 to realize black and white display or color display, so that the display panel 200 may still achieve a good display effect in weak ambient light.

Here, the light-emitting substrate 100 may be configured to emit white light, or may be configured to emit colored light.

Exemplarily, as shown in FIG. 2 and FIG. 3, the light-emitting substrate 100 is configured to emit white light, and the display panel 200 includes the color filter layer 233. In this case, the white light is directly emitted to the display panel 200 to realize color display.

Exemplarily, as shown in FIG. 2 and FIG. 3, the light-emitting substrate 100 is configured to emit colored light, and the display panel 200 does not include the color filter layer 233, so as to avoid interference between the color filter layer 233 and the colored light emitted by the light-emitting substrate 100. In this case, the colored light is directly emitted to the display panel 200 to realize color display.

Figure 5:
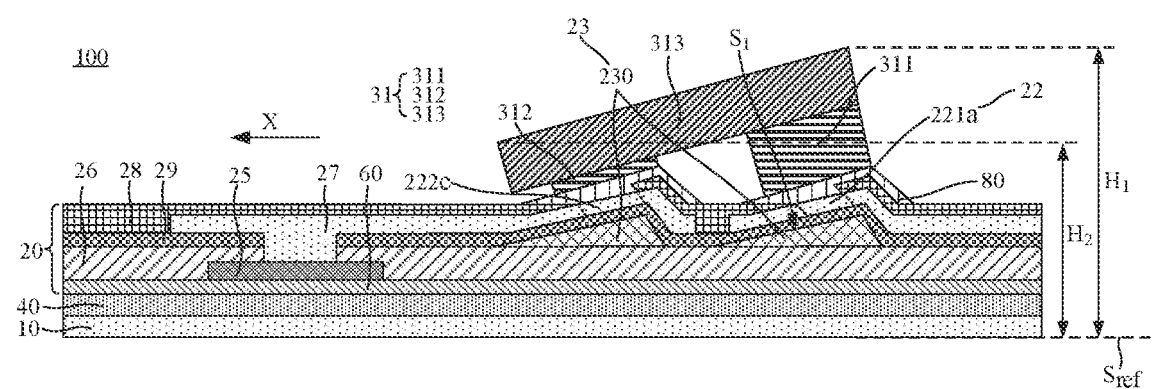
FIG. 5 is a cross-section taken along the section line A-A' in FIG. 4.
Figure 7A:
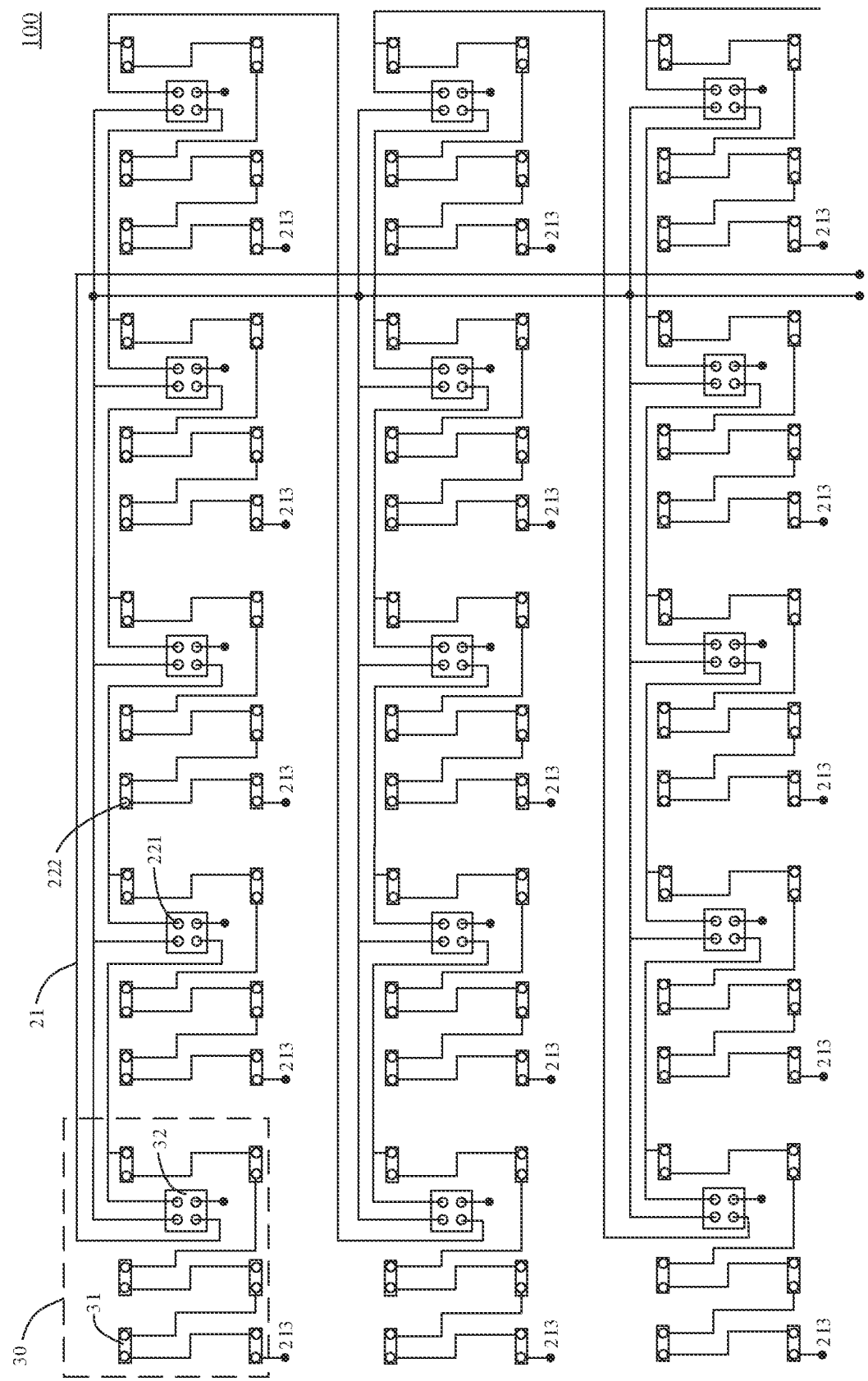
FIG. 7A is a circuit diagram of a light-emitting substrate, in accordance with some embodiments.

In some embodiments, referring to FIG. 2, FIG. 5 and FIG. 7A, the light-emitting substrate 100 includes a transparent substrate 10, a wiring layer 20 and light-emitting units 30, the wiring layer 20 is disposed on a side of the transparent substrate 10 proximate to the display panel 200, and the light-emitting units 30 are arranged in an array on a side of the wiring layer 20 away from the transparent substrate 10.

It will be noted that a transmittance of the transparent substrate 10 is greater than or equal to 95%, and a material of the transparent substrate 10 includes glass.

Figure 4:
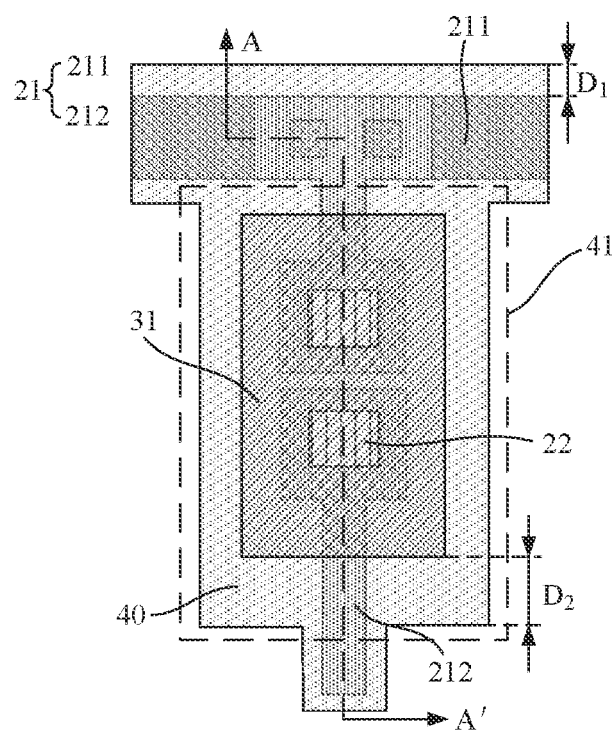
FIG. 4 is a top view of a light-emitting device in a light-emitting substrate, in accordance with some embodiments.

As shown in FIG. 4, FIG. 5 and FIG. 7A, the wiring layer 20 includes circuit traces 21 and pads 22; the circuit traces 21 include signal lines 211 and transfer lines 212, and the pads 22 include drive pads 221 and light-emitting device pads 222. Each light-emitting unit 30 includes a plurality of light-emitting devices 31 connected in series and/or in parallel and at least one driving chip 32; the light-emitting devices 31 are connected to light-emitting device pads 222, the driving chip 32 is connected to driving pads 221, and the driving chip 32 is configured to drive the plurality of light-emitting devices 31 to emit light.

Exemplarily, as shown in FIG. 7A, each light-emitting unit 30 includes six light-emitting devices 31 sequentially connected in series and one driving chip 32. Of course, each light-emitting unit 30 may include four, five, seven, or eight light-emitting devices 31, and the plurality of light-emitting devices 31 in the light-emitting unit 30 are not limited to be only connected in series, these light-emitting devices 31 may be connected in parallel, and the embodiments of the present disclosure are not limited thereto.

Figure 7B:
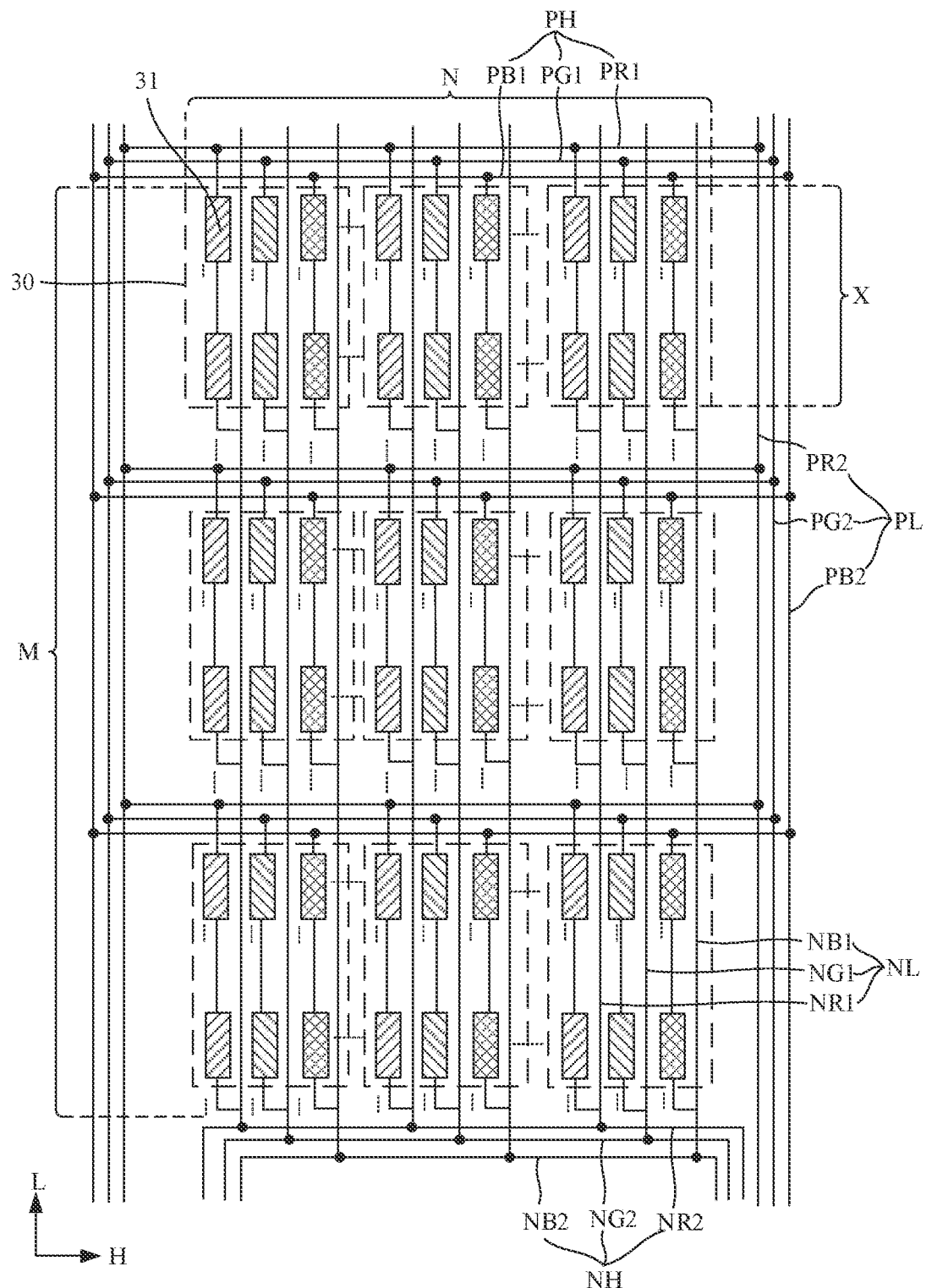
FIG. 7B is a circuit diagram of a light-emitting substrate, in accordance with some other embodiments.

Exemplarily, as shown in FIG. 7B, the light-emitting substrate 100 includes a plurality of light-emitting devices 31, and the plurality of light-emitting devices 31 are arranged in M rows and N columns; light emitted by light-emitting devices 31 in a same column have a same color, and light emitted by every adjacent three columns of light-emitting devices 31 have different colors. For example, colors (i.e., light-emitting colors) of light emitted by every adjacent three columns of light-emitting devices 31 are red, green and blue, respectively.

In each column of light-emitting devices 31, adjacent X light-emitting devices 31 are sequentially connected in series starting with a first light-emitting device 31, and X is greater than or equal to 1 and less than or equal to M (1≤X≤M), where X is an integer. Here, the X light-emitting devices 31 connected in series are defined as a group of light-emitting devices 31; and adjacent three groups of light-emitting devices 31 in a row direction H may form a light-emitting unit 30.

On this basis, in the M times N (M×N) light-emitting devices 31, a plurality of groups of light-emitting devices 31 with a same light-emitting color are connected in parallel.

Exemplarily, every light-emitting devices 31 of X rows and the N columns correspond to a group of row positive wires PH extending in the row direction H, and each group of row positive wires PH includes a first row positive wire PR1, a second row positive wire PG1 and a third row positive wire PB1. In this way, there are M divided by X (M/X) groups of row positive wires PH in total. In addition, a plurality of row positive wires PH for light-emitting devices 31 with a same light-emitting color are connected to respective column positive wires PL extending in a column direction L at an outer side of the light-emitting device 31 of the M rows and the N columns. The first row positive wire PR1 is connected to a first column positive wire PR2, the second row positive wire PG1 is connected to a second column positive wire PG2, and the third row positive wire PB1 is connected to a third column positive wire PB2.

In addition, each column of light-emitting devices 31 corresponds to one column negative wire NL, and a plurality of column negative wires NL corresponding to a plurality of columns of light-emitting devices 31 with a same light-emitting color are connected to a same row negative wire NH. For example, the column negative wires NL may include a plurality of first column negative wires NR1, a plurality of second column negative wires NG1 and a plurality of third column negative wires NB1; the row negative wires NH include a first row negative wires NR2, a second row negative wire NG2 and a third row negative wire NB2; and the plurality of first column negative wires NR1 are connected to the first row negative wire NR2, the plurality of second column negative wires NG are connected to the second row negative wire NG2, and the plurality of third column negative wires NB1 are connected to the third row negative wire NB2.

In this way, the light-emitting devices 31 with different light-emitting colors can be independently controlled, so that brightness and color required by the light-emitting substrate 100 may be achieved by controlling brightness of the light-emitting devices 31 with different light-emitting colors.

The plurality of signal lines 211 may include driving voltage lines 213. As shown in FIG. 7A, a driving voltage line 213 is connected to a driving chip 32, and a plurality of light-emitting devices 31 are disposed on a circuit of the driving voltage line 213 and the driving chip 32. Here, the driving voltage line 213 is configured to transmit a driving voltage to drive the light-emitting devices 31 to emit light.

It will be noted that a connection between the driving voltage line 213 and at least one of the light-emitting device 31 and the driving chip 32, and a connection between the light-emitting devices 31, both may be made by transfer lines 212, and the embodiments of the present disclosure are not limited thereto.

In addition, the light-emitting device 31 in the light-emitting substrate 100 may be a small-sized light-emitting diode (LED). The small-sized LED may be a micro LED or a mini LED. Here, a size (for example, length) of the micro LED is less than 50 micrometers (μm), for example, the size is in a range of 10 micrometers to 50 micrometers, inclusive; a size (for example, length) of the mini LED is 50 micrometers to 150 micrometers, for example, the size is in a range of 30 micrometers to 120 micrometers, inclusive.

For ease of illustration, all of the pads mentioned below refer to light-emitting device pads.

In a case, in order to reduce an interference of light, reflected by metals (circuit traces and pads) in a light-emitting substrate to its outside and emitted from side surfaces of light-emitting devices in the light-emitting substrate directly to the outside, with displayed images, an organic material generally serves as a light-shielding layer to shield the metals and the light-emitting devices which are in the light-emitting substrate, and the light-shielding layer is covered with a resin layer to prevent the organic material from contaminating a chamber of a plasma chemical vapor deposition apparatus, which results in a lower production efficiency of the light-emitting substrate. In addition, since the resin layer itself has a color, the light emitted from a display apparatus having the light-emitting substrate needs to pass through the resin layer, thereby generating a color cast problem. Moreover, a distance between the light-emitting devices and a transparent substrate of the light-emitting substrate is relatively large, in order to prevent light from the side surfaces of the light-emitting devices from exiting out of the transparent substrate, a size of a portion, protruding out of the light-emitting devices, of the light-shielding layer is relatively large. As a result, it causes a transmittance of the display apparatus to be reduced, and reduces display brightness.

In light of this, the light-emitting substrate 100 provided by some embodiments of the present disclosure, as shown in FIG. 4 and FIG. 5, further includes a first metal light-shielding layer 40.

The first metal light-shielding layer 40 is disposed between the transparent substrate 10 and the wiring layer 20; and orthographic projections of the circuit traces 21, the pads 22 and the light-emitting devices 31 on the transparent substrate 10 are all located within an orthographic projection of the first metal light-shielding layer 40 on the transparent substrate 10.

As can be seen from the above, sides, proximate to the transparent substrate 10, of the circuit traces 21, the pads 22 and the light-emitting devices 31 are all shielded by the first metal light-shielding layer 40. In this way, the first metal light-shielding layer 40 may reduce the ambient light directed towards the circuit traces 21 and the pads 22, and reduce light reflected by the circuit traces 21 and the pads 22 from being directed towards the outside, thereby reducing the interference caused by the light reflected by the circuit traces 21 and the pads 22 to the displayed images. Moreover, the first metal light-shielding layer 40 may also reduce the light emitted from side surfaces of the light-emitting devices 31 directly to the outside, thereby reducing the interference caused by the light emitted from the side surfaces of the light-emitting devices 31 directly to the outside.

In addition, in a plasma chemical vapor deposition process, since a material of the first metal light-shielding layer 40 includes metal, no pollution is caused to a chamber of a plasma chemical vapor deposition apparatus, and therefore, a resin layer does not need to be provided for protection. In this way, a process of manufacturing the light-emitting substrate 100 may be simplified, the production efficiency may be improved, and the problem of color shift caused by the resin layer may be avoided. Moreover, compared with the case in which the light-shielding layer is made of the organic material, the first metal light-shielding layer 40 made of the metal material may be set to be thin, and a distance between the light-emitting devices 31 and the transparent substrate 10 may be reduced, so that in a case where the light from the side surfaces of the light-emitting devices 31 is totally reflected on a surface of the transparent substrate 10 away from the light-emitting devices 31, a size of a portion, protruding out of the light-emitting devices 31, of the first metal light-shielding layer 40 may be reduced compared with that of the case, thereby improving the transmittance of the display apparatus 1000 and improving the display brightness.

The material of the first metal light-shielding layer 40 may include molybdenum oxide and/or molybdenum niobium oxide; exemplarily, the material of the first metal light-shielding layer 40 includes molybdenum dioxide ($MoO_2$) and molybdenum trioxide ($MoO_3$), and the embodiments of the present disclosure are not limited thereto.

In addition, a thickness of the first metal light-shielding layer 40 may be in a range of 400 angstroms (Å) to 500 angstroms (Å), inclusive; exemplarily, the thickness of the first metal light-shielding layer 40 is any one of 400 Å, 420 Å, 430 Å, 450 Å, 460 Å, 480 Å, and 500 Å, and the embodiments of the present disclosure are not limited thereto.

Figure 6:
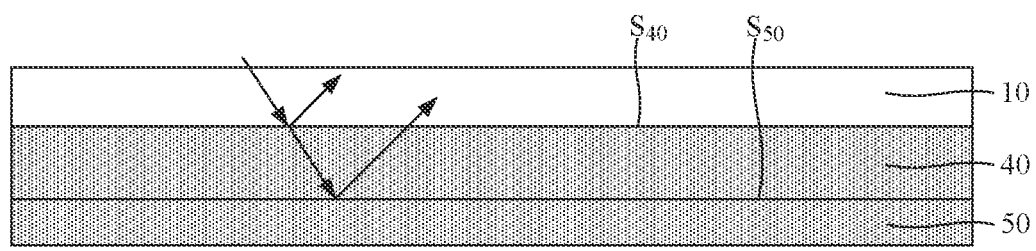
FIG. 6 is a structural diagram of a first metal light-shielding layer and a second metal light-shielding layer in a light-emitting substrate, in accordance with some embodiments.

In some embodiments, referring to FIG. 5 and FIG. 6, the light-emitting substrate 100 further includes a second metal light-shielding layer 50 which is disposed between the first metal light-shielding layer 40 and the wiring layer 20.

At least part of the ambient light reflected by a surface $S_{50}$ of the second metal light-shielding layer 50 proximate to the transparent substrate 10 and at least part of the ambient light reflected by a surface $S_{40}$ of the first metal light-shielding layer 40 proximate to the transparent substrate 10 can interfere destructively with each other, thereby reducing interference caused by the light reflected by the first metal light-shielding layer 40 to the displayed images.

Here, by arranging the second metal light-shielding layer 50, at least part of the ambient light reflected by the surface of the second metal light-shielding layer 50 proximate to the transparent substrate 10 and at least part of the ambient light reflected by the surface of the first metal light-shielding layer 40 proximate to the transparent substrate 10 can interfere destructively with each other, so that the overall reflectivity of the first metal light-shielding layer 40 and the second metal light-shielding layer 50 is less than or equal to 8%.

It can be understood that an optical path difference between the ambient light reflected by the surface of the second metal light-shielding layer 50 proximate to the transparent substrate 10 and the ambient light reflected by the surface of the first metal light-shielding layer 40 proximate to the transparent substrate 10 is substantially equal to an odd multiple of a half wavelength, so that the light can interfere destructively with each other. The optical path difference between the ambient light reflected by the surface of the second metal light-shielding layer 50 proximate to the transparent substrate 10 and the ambient light reflected by the surface of the first metal light-shielding layer 40 proximate to the transparent substrate 10 is related to the thickness of the first metal light-shielding layer 40, Based on the above, the thickness of the first metal light-shielding layer 40 may be in the range of 400 Å to 500

Å, inclusive. In this way, most ambient light reflected by the surface of the second metal light-shielding layer 50 proximate to the transparent substrate 10 and the ambient light reflected by the surface of the first metal light-shielding layer 40 proximate to the transparent substrate 10 can interfere destructively with each other, so that the overall reflectivity of the first metal light-shielding layer 40 and the second metal light-shielding layer 50 is less than or equal to 8%.

A material of the second metal light-shielding layer 50 includes molybdenum oxide and/or molybdenum niobium oxide; exemplarily, the material of the second metal light-shielding layer 50 includes molybdenum oxide ($MoO_2$) and molybdenum trioxide ($MoO_3$), and the embodiments of the present disclosure are not limited thereto.

It will be noted that the material of the second metal light-shielding layer 50 may be the same as or different from the material of the first metal light-shielding layer 40, and the embodiments of the present disclosure are not limited thereto.

In addition, a thickness of the second metal light-shielding layer 50 may be in a range of 100 Å to 500 Å, inclusive. Exemplarily, the thickness of the second metal light-shielding layer 50 is any one of 100 Å, 150 Å, 200 Å, 250 Å, 300 Å, 350 Å, 400 Å, 450 Å, and 500 Å, and the embodiments of the present disclosure are not limited thereto.

It will be noted that an orthographic projection of the second metal light-shielding layer 50 on the transparent substrate 10 may substantially coincide with the orthographic projection of the first metal light-shielding layer 40 on the transparent substrate 10.

In some embodiments, as shown in FIG. 4 and FIG. 5, a distance $D_1$ between a border of an orthographic projection of a circuit trace 21 on the transparent substrate 10 and a border of the orthographic projection of the first metal light-shielding layer 40 on the transparent substrate 10 is greater than or equal to 0.5 µm. In this way, the circuit trace 21 may be completely shielded by the first metal light-shielding layer 40, thereby reducing the interference caused by the light reflected by the circuit trace 21 to the displayed images. Moreover, a size of a portion, protruding out of the circuit trace 21, of the first metal light-shielding layer 40 is not too large, which avoids greatly reducing the transmittance of the display apparatus 1000, and the display brightness of the display apparatus 1000 is high.

In some embodiments, as shown in FIG. 4 and FIG. 5, a distance $D_2$ between a border of the orthographic projection of the first metal light-shielding layer 40 on the transparent substrate 10 and a border of an orthographic projection of a light-emitting device 31 on the transparent substrate 10 is greater than or equal to $W_1$. The $W_1$ may be obtained by using the following formula (1):

$$W_1 = H_1 \times \tan\theta; \quad (1)$$

where $H_1$ is a maximum perpendicular distance between a surface of the light-emitting device 31 away from the transparent substrate 10 and a surface of the transparent substrate 10 away from the light-emitting device 31; and $\theta$ is a total reflection angle of the surface of the transparent substrate 10 away from the light-emitting device 31.

In this case, of light emitted from side surfaces of the light-emitting device 31 to the transparent substrate 10, a part is shielded by the first metal light-shielding layer 40, and the remaining part, directed on the surface of the transparent substrate 10 away from the light-emitting device 31, has an included angle with this surface, which is greater than or equal to the total reflection angle of this surface. That is, the remaining part of the light will be totally reflected on the surface of the transparent substrate 10 away from the light-emitting device 31. In this way, the light emitted from the side surfaces of the light-emitting device 31 to the transparent substrate 10 does not exit out of the transparent substrate 10, thereby avoiding the interference with the displayed images due to the light emitted from the side surfaces of the light-emitting device 31 to the transparent substrate 10 after being transmitted out of the transparent substrate 10, and improving the display effect.

A distance $D_2$ between a border of the orthographic projection of the first metal light-shielding layer 40 on the transparent substrate 10 and a border of an orthographic projection of each light-emitting device 31 on the transparent substrate 10 is greater than or equal to $W_1$, so that the process is simple.

Exemplarily, the distance $D_2$ between the border of the orthographic projection of the first metal light-shielding layer 40 on the transparent substrate 10 and the border of the orthographic projection of the light-emitting device 31 on the transparent substrate 10 is greater than or equal to 4.2 µm. In this way, the light emitted from the side surfaces of the light-emitting device 31 to the transparent substrate 10 does not exit out of the transparent substrate 10, thereby avoiding interference with the displayed images. Moreover, the size of the portion, protruding out of the light-emitting device 31, of the first metal light-shielding layer 40 is not too large, so that an aperture ratio of the display apparatus 1000 is greatly reduced, the transmittance of the display apparatus 1000 is improved, and the display brightness is improved.

In some other embodiments, referring to FIG. 4 and FIG. 5, the orthographic projections of the light-emitting devices 31 on the transparent substrate 10 each are a first projection pattern, the first metal light-shielding layer 40 includes set light-shielding patterns 41 each for shielding a light-emitting device 31, an orthographic projection of the set light-shielding pattern 41 on the transparent substrate 10 is a second projection pattern, and a distance between a border of the first projection pattern and a border of the second projection pattern at a same side is greater than or equal to $W_2$. The $W_2$ may be obtained by using the following formula (2):

$$W_2 = H_2 \times \tan\theta; \quad (2)$$

where the borders, at the same side, of the first projection pattern and the second projection pattern is a first border and a second border, respectively; $H_2$ is a maximum perpendicular distance between a side edge, corresponding to the first border, of the surface of the light-emitting device 31 away from the transparent substrate 10 and the surface of the transparent substrate 10 away from the light-emitting device 31; and $\theta$ is the total reflection angle of the surface of the transparent substrate 10 away from the light-emitting device 31. It will be noted that heights $H_2$ of borders at different sides are not necessarily the same, and FIG. 5 is a schematic diagram in which $H_2$ is at a single side, and the $H_2$ may contain the foregoing $H_1$.

In this case, of light emitted from side surfaces of the light-emitting device 31 to the transparent substrate 10, a part is shielded by the first metal light-shielding layer 40, and the remaining part, directed on the surface of the transparent substrate 10 away from the light-emitting device 31, has an included angle with this surface, which is greater than or equal to the total reflection angle of this surface. That is, the remaining part of the light will be totally reflected on the surface of the transparent substrate 10 away from the light-emitting device 31. In this way, the light emitted from the side surfaces of the light-emitting device 31 to the transparent substrate 10 does not exit out of the transparent substrate 10, thereby avoiding the interference with the displayed images due to the light emitted from the side surfaces of the light-emitting device 31 to the transparent substrate 10 after being transmitted out of the transparent substrate 10, and improving the display effect.

Here, according to a maximum perpendicular distance between each side surface of the light-emitting device 31 and the surface of the transparent substrate 10 away from the light-emitting device 31, a size of a portion, protruding out of a corresponding side surface of the light-emitting device 31, of the first metal light-shielding layer 40 may be set. In the case where the light from the side surfaces of the light-emitting device 31 to the transparent substrate 10 will not exit the transparent substrate 10, the transmittance of the display apparatus 1000 may be improved as much as possible, and the display brightness may be improved.

Figure 10:
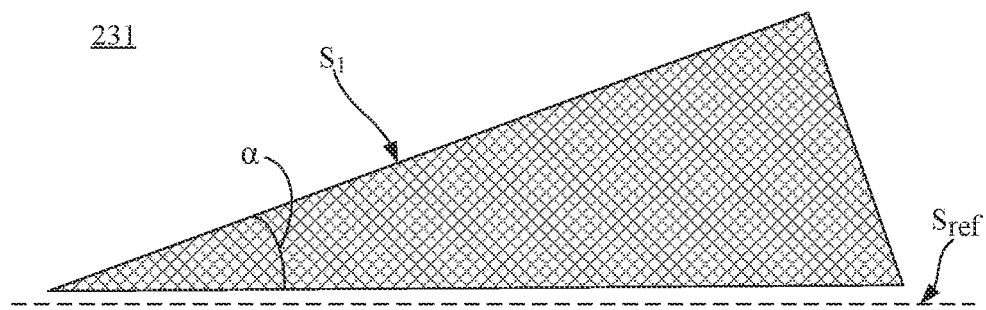
FIG. 10 is a partial enlarged view of a support portion in a light-emitting substrate, in accordance with some embodiments.

In some embodiments, referring to FIG. 5 and FIG. 10, the wiring layer 20 includes a support layer 23, the support layer 23 includes a plurality of support patterns 230, each support pattern 230 includes two support portions 231, each support portion 231 has a first side surface $S_1$, the first side surface $S_1$ is a side surface in a direction in which the support portions 231 are arranged, and the first side surface $S_1$ is obliquely disposed relative to a reference surface $S_{ref}$. The reference surface $S_{ref}$ is a plane where the surface of the transparent substrate 10 away from the light-emitting device 31 is located.

As shown in FIG. 5, the light-emitting device 31 includes an anode pin 311 and a cathode pin 312, the wiring layer 20 includes anode pads 221a and cathode pads 222c, the anode pin 311 is electrically connected to an anode pad 221a, and the cathode pin 312 is electrically connected to a cathode pad 222c. The anode pad 221a and the cathode pad 222c are respectively located on first side surfaces $S_1$ of two support portions 231.

Figure 8:
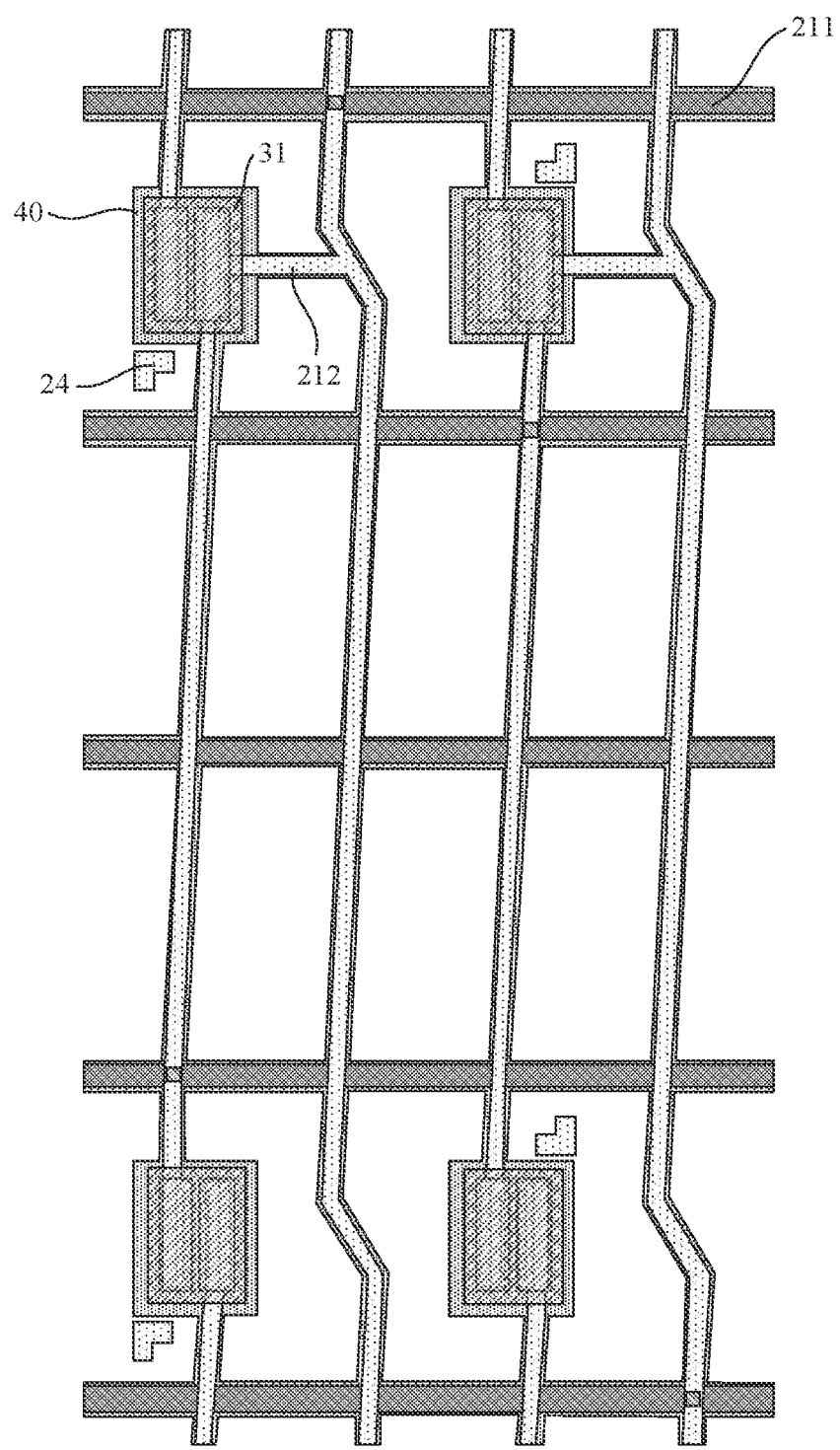
FIG. 8 is a partial enlarged view of a light-emitting substrate, in accordance with some embodiments.
Figure 9:
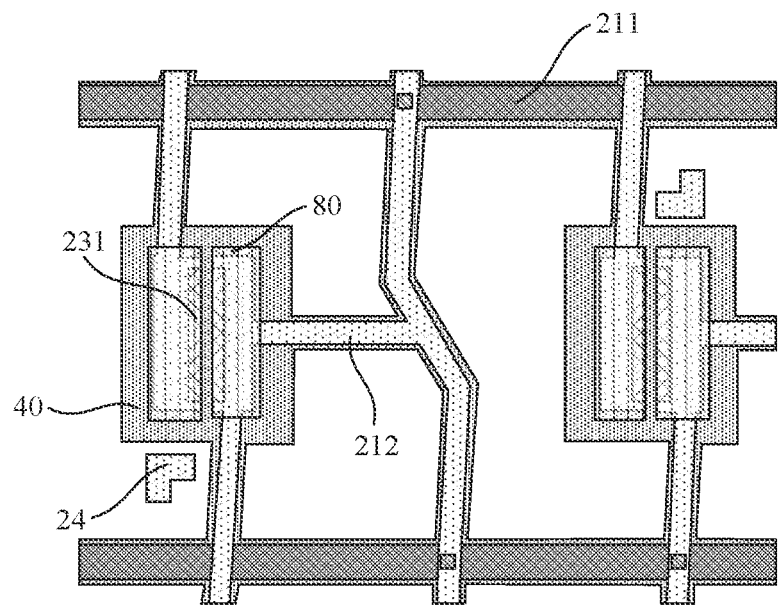
FIG. 9 is a partial enlarged view of a light-emitting substrate not mounted with a light-emitting device, in accordance with some embodiments.

It will be noted that, referring to FIG. 8 and FIG. 9, the wiring layer 20 further includes a plurality of markers 24, each marker 24 corresponds to a light-emitting device 31, and an orthographic projection of the marker 24 on the transparent substrate 10 is located outside an orthographic projection of the light-emitting device 31 on the transparent substrate 10, so that the anode pin 311 of the light-emitting device 31 may be aligned with and electrically connected to the anode pad 221a, and the cathode pin 312 may be aligned with and electrically connected to the cathode pad 222c.

It can be understood that the light-emitting device 31 further includes a light-emitting portion 313, and the anode pin 311 and the cathode pin 312 are located on a same side of the light-emitting portion 313. Moreover, in a thickness direction of the light-emitting portion 313, a thickness of the anode pin 311 is greater than a thickness of the cathode pin 312. That is, the anode lead 311 and the cathode lead 312 of the light-emitting device 31 have different thicknesses.

In this case, referring to FIG. 5 and FIG. 10, an angle α included between the first side surface $S_1$ of the support portion 231 and the reference surface may be adjusted to balance a difference between the thickness of the anode pin 311 and the thickness of the cathode pin 312, so as to increase a contact area between the anode pin 311 and the anode pad 221a, and a contact area between the cathode pin 312 and the cathode pad 222c.

Exemplarily, as shown in FIG. 5, an end surface of the anode pin 311 away from the light-emitting portion 313 is in surface contact with the anode pad 221a, and an end surface of the cathode pin 312 away from the light-emitting portion 313 is in surface contact with the cathode pad 222c. In this case, the contact area between the anode pin 311 and the anode pad 221a increases, and the contact area between the cathode pin 312 and the cathode pad 222c increases, as a result, a resistance between the anode pin 311 and the anode pad 221a decreases, and a resistance between the cathode pin 312 and the cathode pad 222c decreases, thereby reducing a driving voltage required by the light-emitting device 31, reducing the energy consumption, and improving the bonding yield.

In this case, a surface of the light-emitting portion 313 away from the anode pin 311 and the cathode pin 312 is obliquely disposed relative to the reference surface. Exemplarily, the surface of the light-emitting portion 313 away from the anode pin 311 and the cathode pin 312 is substantially parallel to the first side surface $S_1$ of the support portion 231.

Here, in order to make the end surface of the anode pin 311 away from the light-emitting portion 313 form a large surface contact with the anode pad 221a, and the end surface of the cathode pin 312 away from the light-emitting portion 313 form a large surface contact with the cathode pad 222c, as shown in FIG. 5 and FIG. 10, the angle included between the first side surface $S_1$ of the support portion 231 and the reference surface $S_{ref}$ is α. The α may be obtained by using the following formula (3):

$$\alpha = \arctan(L/S); \quad (3)$$

where L is the difference between the thickness of the anode pin 311 and the thickness of the cathode pin 312; S is a dimension of the cathode pin 312 in a first direction X, and the first direction X is a direction from the anode pin 311 to the cathode pin 312.

Exemplarily, the angle α included between the first side surface $S_1$ and the reference surface is in a range of 8 degrees to 12 degrees, inclusive. In this way, the entire end surface of the anode lead 311 away from the light-emitting portion 313 may form a surface contact with the anode pad 221a, and the entire end surface of the cathode lead 312 away from the light-emitting portion 313 may form a surface contact with the cathode pad 222c.

It will be noted that a shape of the support portion 231 may be a pyramid; the first side surfaces $S_1$ of the two support portions 231 of the support pattern 230 may be substantially parallel; and heights of the two support portions 231 of the support pattern 230 may be substantially equal. Of course, the shape of the support portion 231 may be other shapes, and the embodiments of the present disclosure are not limited thereto.

It can be understood that a distance between the two support portions 231 in the support pattern 230 may be not fixed according to sizes of different light-emitting devices 31. The minimum distance between the two support portions 231 in the support pattern 230 is greater than or equal to 3 µm, which is convenient for the two support portions 231 to be separated, and convenient for an anti-oxidation layer 80 to be disconnected in a case where the anti-oxidation layer 80 is formed on the pads 22.

In addition, a dimension of the orthographic projection of the support portion 231 on the reference surface in the direction in which the two support portions 231 are arranged is greater than or equal to 5 µm, so that the pins of the light-emitting devices 31 may be electrically connected to the corresponding pads 22.

In some embodiments, as shown in FIG. 5, the wiring layer 20 further includes a first conductive layer 25, a first passivation layer 26, a second conductive layer 27, and a second passivation layer 28.

As shown in FIG. 5 and FIG. 8, the first conductive layer 25 is disposed between the support layer 23 and the transparent substrate 10, and the signal lines 211 are disposed in the first conductive layer 25. The first passivation layer 26 is disposed between the first conductive layer 25 and the support layer 23 to prevent the support layer 23 from oxidizing the first conductive layer 25, and insulating the first conductive layer 25 from the second conductive layer 27. The second conductive layer 27 is disposed on a side of the support layer 23 away from the transparent substrate 10, and the transfer lines 212, the markers 24 and the pads 22 are all located in the second conductive layer 27. The second passivation layer 28 is disposed on a side of the second conductive layer 27 away from the transparent substrate 10, the second passivation layer 28 is provided therein with a plurality of openings, and at least part of a portion, located on each first side surface $S_1$ of the support portion 231 (as shown in FIG. 10), of the second conductive layer 27 is exposed by an opening to form a pad 22.

It will be noted that a shape of the opening is not unique, the shape may be a circle, a polygon, or an irregular pattern, and the present disclosure is not limited thereto.

On this basis, referring to FIG. 5, the wiring layer 20 may further include a third passivation layer 29 and a fourth passivation layer 60. The third passivation layer 29 is disposed between the second conductive layer 27 and the support layer 23 to prevent the support layer 23 from oxidizing the second conductive layer 27; and the fourth passivation layer 60 is disposed between the first conductive layer 25 and the first metal light-shielding layer 40 to insulate the first metal light-shielding layer 40 from the first conductive layer 25.

It will be noted that the signal lines 211 located in the first conductive layer 25 and the transfer lines 212 located in the second conductive layer 27 may be electrically connected through via holes, and the via holes extend through the first passivation layer 26 and the third passivation layer 29.

Figure 13:
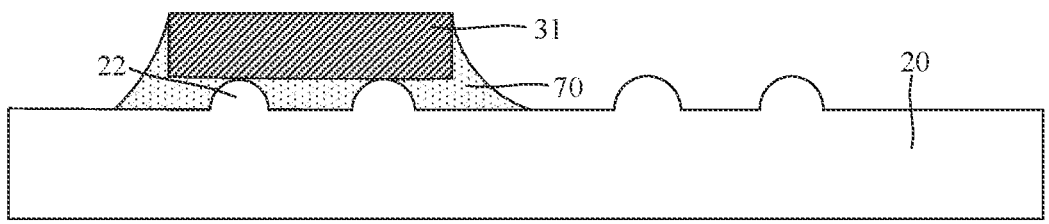

In some embodiments, as shown in FIG. 13, the light-emitting substrate 100 further includes fixing components 70, the fixing components 70 are disposed on a side of the pads 22 away from the transparent substrate 10. The fixing components 70 are configured to connect the pins of the light-emitting devices 31 with the pads 22.

A material of the fixing component 70 includes resin. Exemplarily, the material of the fixing component 70 includes epoxy resin. In this case, in a case where the pads 22 are located on the first side surfaces $S_1$ of the support portions 231, in a process of fixing the pins and the pads 22, because the pads 22 are obliquely arranged and the resin has fluidity, the residual of the resin on a contact interface between the pins and the pads 22 may be avoided, and the influence on an electrical connection between the pads 22 and the pins may be avoided.

In some embodiments, as shown in FIG. 5, the light-emitting substrate 100 further includes an anti-oxidation layer 80. The anti-oxidation layer 80 is disposed on a side of the second passivation layer 28 away from the transparent substrate 10, and covers at least the openings to prevent surfaces of the pads 22 from being exposed to air to be oxidized. Here, the fixing component 70 (as shown in FIG. 13) is disposed on a side of the anti-oxidation layer 80 away from the transparent substrate 10.

It will be noted that the anti-oxidation layer 80 is electrically conductive to ensure that the pads 22 are connected to the pins of the light-emitting devices 31. The material of the anti-oxidation layer 80 includes indium tin oxide and/or gold, and the embodiments of the present disclosure are not limited thereto.

Figure 22:
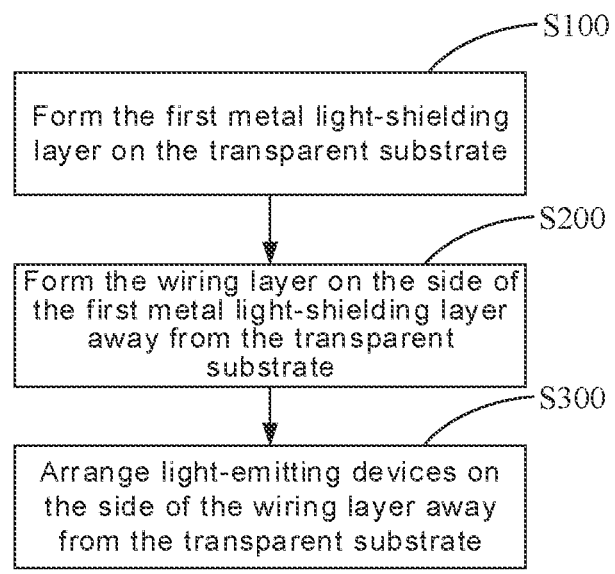
FIGS. 22 to 26 are flow diagrams of a method for manufacturing a light-emitting substrate, in accordance with some embodiments.

Some embodiments of the present disclosure provide a method for manufacturing the light-emitting substrate 100, and referring to FIG. 22, the method for manufacturing the light-emitting substrate 100 includes steps 100 to 300 (S100 to S300).

Figure 14:
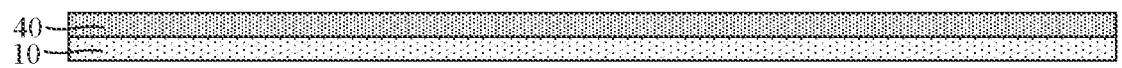
FIGS. 14 to 20 are diagrams showing steps for manufacturing a light-emitting substrate, in accordance with some embodiments.

In S100, as shown in FIG. 14, the first metal light-shielding layer 40 is formed on the transparent substrate 10.

In the above step, a molybdenum and/or molybdenum niobium metal film may be formed on the transparent substrate 10 by a deposition process, and then the metal film is processed by a mask exposure, a development and an etching processes; and finally, the processed metal film is applied with oxygen gas to perform an oxidation treatment, so as to form the first metal light-shielding layer 40.

Figure 20:
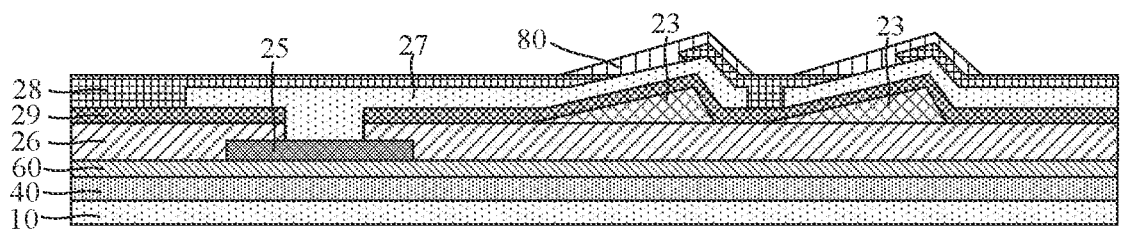

In S200, referring to FIG. 5 and FIG. 20, the wiring layer 20 is formed on the side of the first metal light-shielding layer 40 away from the transparent substrate 10.

In the above step, the formed wiring layer 20 includes the circuit traces 21 and the pads 22, and the orthographic projections of the circuit traces 21 and the pads 22 on the transparent substrate 10 are located within the orthographic projection of the first metal light-shielding layer 40 on the transparent substrate 10. Here, the circuit traces 21 may include the signal lines 211 and the transfer lines 212.

Figure 23:
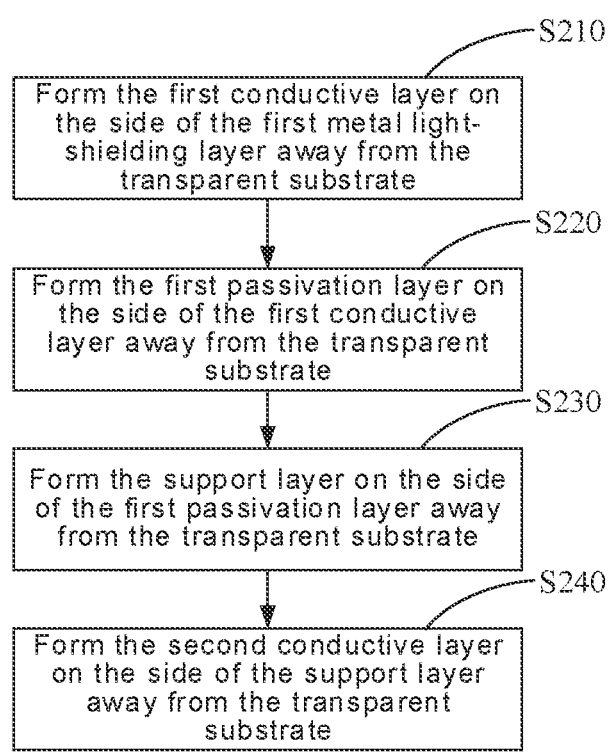

In some embodiments, referring to FIG. 23, S200 includes steps 210 to 240 (S210 to S240).

Figure 15:
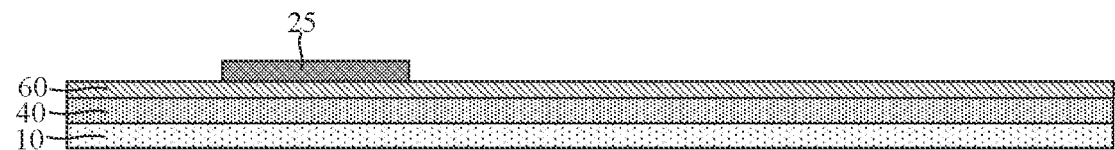

In S210, as shown in FIG. 15, the first conductive layer 25 is formed on the side of the first metal light-shielding layer 40 away from the transparent substrate 10.

In the above step, the signal lines 211 are located in the first conductive layer 25. A first conductive film may be formed on the transparent substrate 10 by a deposition process, and then the first conductive film is processed by a mask exposure, a development and an etching processes to form the first conductive layer 25.

It will be noted that the fourth passivation layer 60 is formed between the first conductive layer 25 and the first metal light-shielding layer 40.

Figure 16:
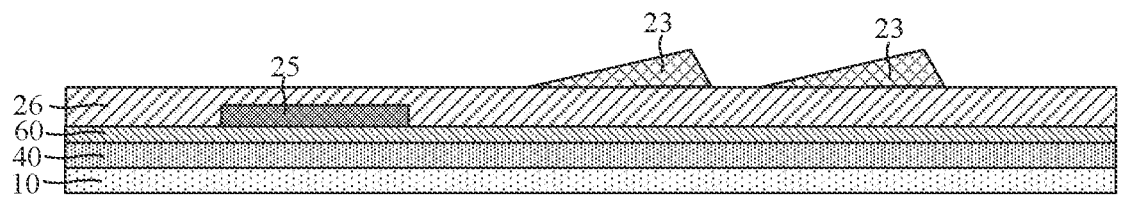

In S220, as shown in FIG. 16, the first passivation layer 26 is formed on the side of the first conductive layer 25 away from the transparent substrate 10.

In the above step, the material of the first passivation layer 26 is an inorganic insulating material, which may include at least one of silicon nitride, silicon oxynitride, and silicon oxide. Exemplarily, the material of the first passivation layer 26 includes the silicon nitride.

The first passivation layer 26 may be formed on the side of the first conductive layer 25 away from the transparent substrate 10 by a deposition process.

In S230, as shown in FIG. 16, the support layer 23 is formed on the side of the first passivation layer 26 away from the transparent substrate 10.

In the above step, referring to FIG. 5 and FIG. 10, the support layer 23 includes the plurality of support patterns 230, each support pattern 230 includes two support portions 231, each support portion 231 has the first side surface $S_1$, and the first side surface $S_1$ is obliquely disposed relative to the reference surface; and the reference surface is the plane where the surface of the transparent substrate 10 away from the light-emitting device 31 is located.

The material of the support layer 23 includes an organic material. For example, the material of the support layer 23 includes organic resin.

Figure 24:
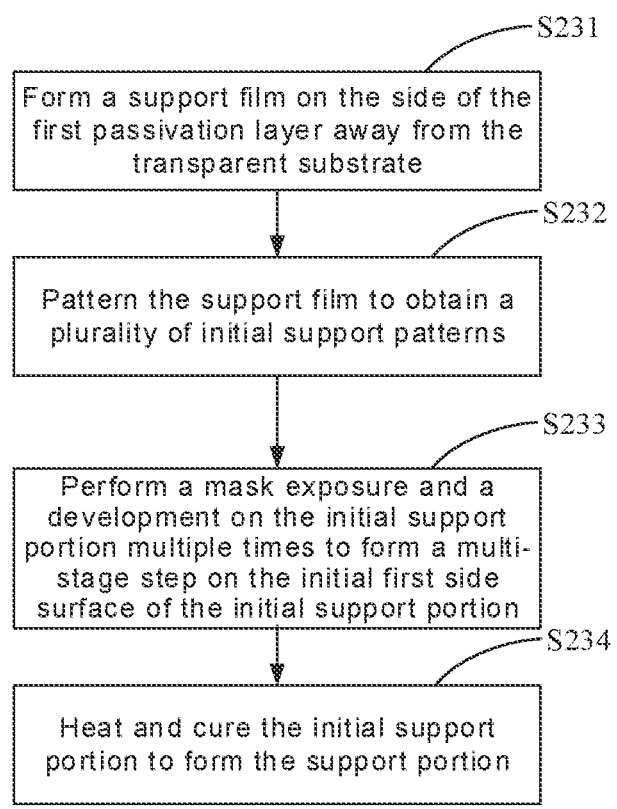

In some embodiments, referring to FIG. 24, S230 includes steps 231 to 234 (S231 to S234).

In S231, a support film is formed on the side of the first passivation layer 26 away from the transparent substrate 10.

In the above step, the support film may be formed by a deposition process.

Figure 21:
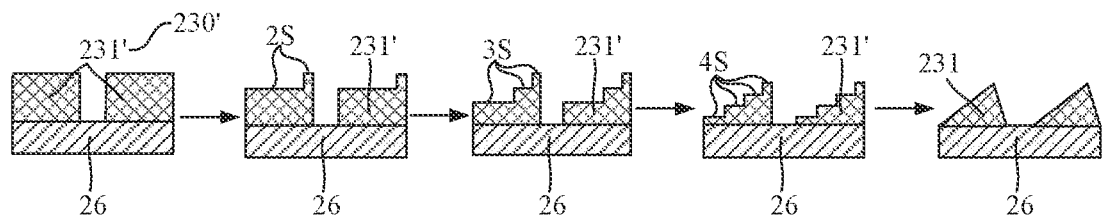
FIG. 21 is a diagram showing steps for manufacturing a support portion of a light-emitting substrate, in accordance with some embodiments.

In S232, referring to FIG. 21, the support film is patterned to obtain a plurality of initial support patterns 230'.

In the above step, each initial support pattern includes two initial support portions, each initial support portion includes an initial first side surface, and the initial first side surface is a side surface in a direction in which the two initial support portions are arranged.

In S233, referring to FIG. 21, a mask exposure and a development are performed on the initial support portion multiple times, so that the initial first side surface of the initial support portion forms a multi-stage step.

In the above step, the mask exposure, the development and an etching processes may be performed cyclically and multiple times to form the multi-stage step. Exemplarily, as shown in FIG. 21, the mask exposure, the development and the etching process are performed on the initial support portion 231' a first time to form a two-stage step 2S; and then, the mask exposure, the development and the etching process are performed on the initial support portion 231' a second time to form a third-stage step 3S; and finally, the mask exposure, the development and the etching process are performed on the initial support portion 231' a third time to form a four-stage step 4S.

In S234, referring to FIG. 21, the initial support portion 231' is heated and cured to form the support portion 231.

In the above step, in the process of heating the initial support portion, the initial support portion is in a molten state, and the multi-stage step melts and naturally flows under the action of gravity; after curing, the first side surface of the support portion 231 is formed.

It will be noted that a heating temperature may be in a range of 220° C. to 240° C., inclusive; and a heating time may be in a range of 1.5 hours to 2.5 hours, inclusive.

Figure 18:
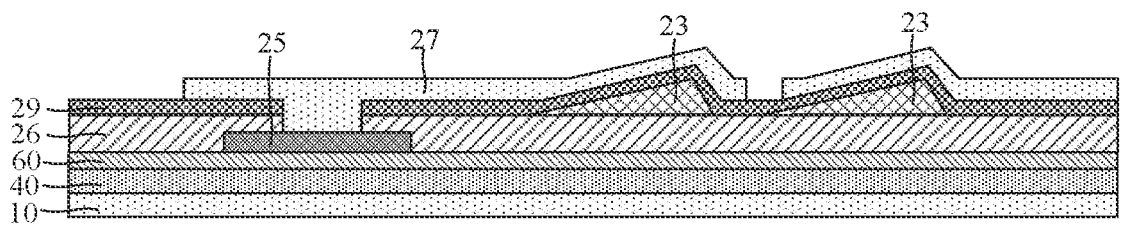

In S240, as shown in FIG. 18, the second conductive layer 27 is formed on the side of the support layer 23 away from the transparent substrate 10.

In the above step, the transfer lines 212 and the pads 22 are formed in the second conductive layer 27. A second conductive film may be formed on the side of the support layer 23 away from the transparent substrate 10 by a deposition process, and then the second conductive film is processed by a mask exposure, a development and an etching processes to form the second conductive layer 27.

Figure 17:
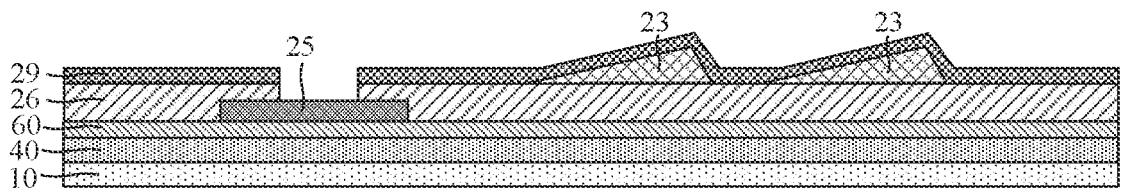
Figure 19:
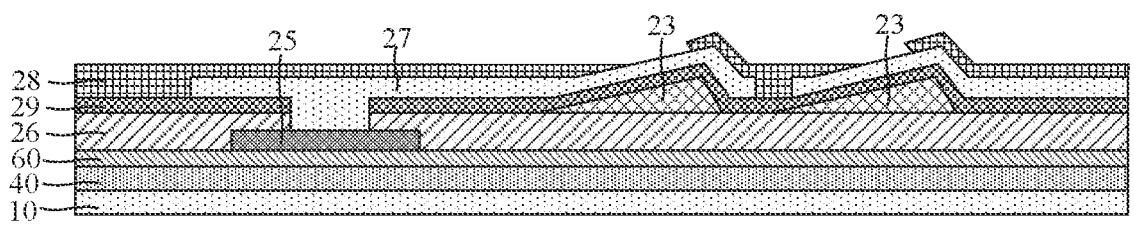

It will be noted that, as shown in FIG. 17 and FIG. 18, the third passivation layer 29 is formed between the second conductive layer 27 and the support layer 23. As shown in FIG. 19 and FIG. 20, the second passivation layer 28 is formed on the side of the second conductive layer 27 away from the transparent substrate 10, and as shown in FIG. 5, the anti-oxidation layer 80 is formed on the side of the pad 22 of the second conductive layer 27 away from the transparent substrate 10.

In S300, as shown in FIG. 5, the light-emitting device 31 is arranged on the side of the wiring layer 20 away from the transparent substrate 10.

In the above step, the light-emitting devices 31 are electrically connected to the pads 22. The orthographic projections of the light-emitting devices 31 on the transparent substrate 10 are located within the orthographic projection of the first metal light-shielding layer 40 on the transparent substrate 10.

Figure 25:
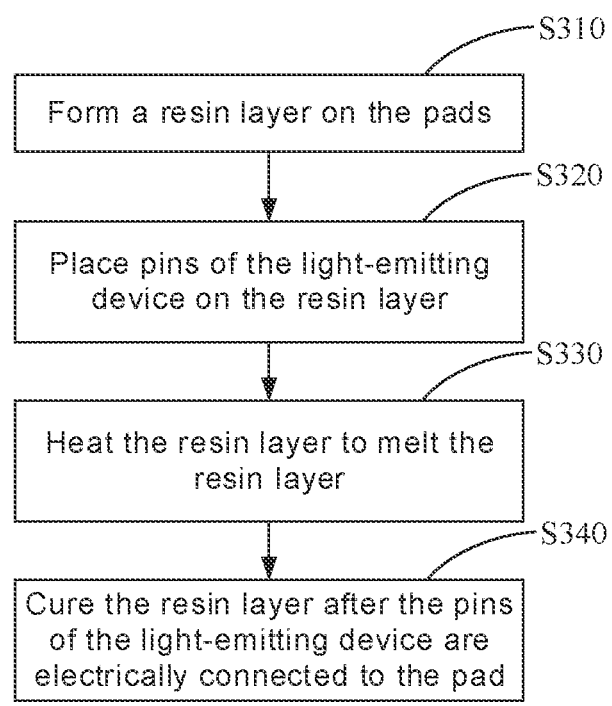

In some embodiments, referring to FIG. 25, the S300 includes steps 310 to 340 (S310 to S340).

Figure 11:
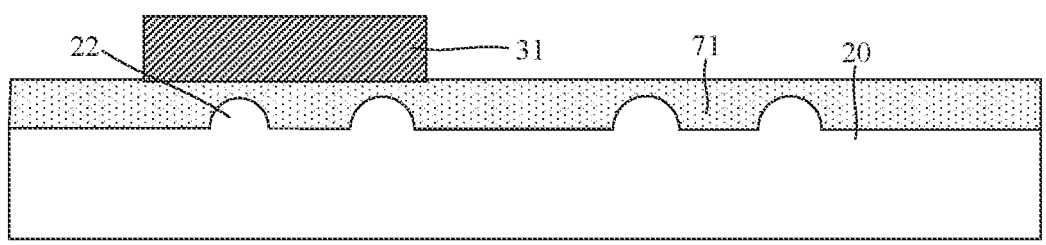
FIGS. 11 to 13 are diagrams showing steps for fixing a light-emitting device in a light-emitting substrate, in accordance with some embodiments.

In S310, referring to FIG. 11, a resin layer 71 is formed on the pads 22.

In the above step, the resin layer 71 may be formed on the pads 22 by a coating process. Here, the resin layer 71 is an initial fixing component.

In S320, referring to FIG. 11, pins of the light-emitting device 31 are placed on the resin layer 71.

In the above step, the pins of the light-emitting device 31 and the resin layer 71 may be aligned by using the above-mentioned marker 24.

Figure 12:
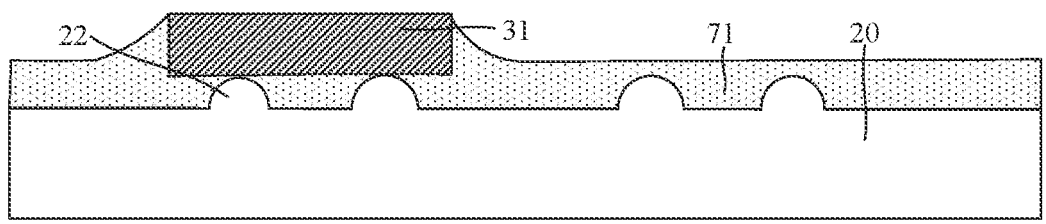

In S330, referring to FIG. 11 and FIG. 12, the resin layer 71 is heated to melt the resin layer 71.

In the above step, since the pad 22 is obliquely arranged and the resin has fluidity, during the heating process, the resin layer 71 is melted and naturally flows under the action of gravity, so that the residual of the resin on the contact interface between the pin and the pad 22 may be avoided, and the influence on the electrical connection between the pad 22 and the pin is avoided.

In S340, referring to FIG. 12 and FIG. 13, after the pins of the light-emitting device 31 is electrically connected to the pad 22, the resin layer is cured.

In the above step, after the resin layer is cured, the fixing component 70 is formed. In this way, no resin residue exists on the contact interface between the pins of the light-emitting device 31 and the pad 22.

Figure 26:
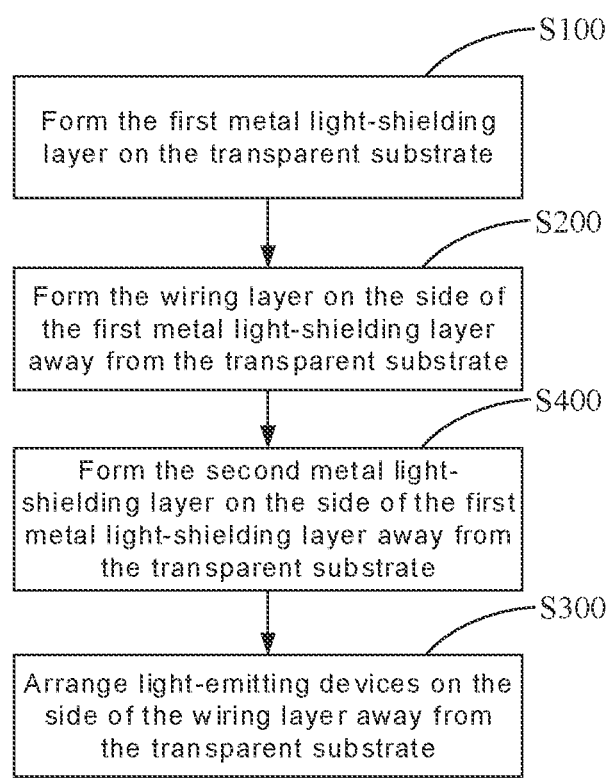

In some embodiments, referring to FIG. 26, between S200 and S300, the manufacturing method further includes a step 400 (S400).

In S400, referring to FIG. 6, the second metal light-shielding layer 50 is formed on the side of the first metal light-shielding layer 40 away from the transparent substrate 10.

In the above step, at least part of the ambient light reflected by the surface of the second metal light-shielding layer 50 proximate to the transparent substrate 10 and at least part of ambient light reflected by the surface of the first metal light-shielding layer 40 proximate to the transparent substrate 10 can interfere destructively with each other.

Here, a molybdenum and/or molybdenum niobium metal film may be formed on the side of the first metal light-shielding layer 40 away from the transparent substrate 10 by a deposition process, and then the metal film is processed by a mask exposure, a development and an etching; and finally, the processed metal film is applied with oxygen gas to perform an oxidation treatment, so as to form the second metal light-shielding layer 50.

It will be noted that, a rate of oxygen introduction in S100 may be different from a rate of oxygen introduction in S400, so that the first metal light-shielding layer 40 and the second metal light-shielding layer 50 have different extinction coefficients.

The above are only specific embodiments of the present disclosure, but the scope of protection of the present disclosure is not limited thereto, and any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A light-emitting substrate, comprising:
   a transparent substrate;
   a first metal light-shielding layer disposed on the transparent substrate;
   a wiring layer disposed on a side of the first metal light-shielding layer away from the transparent substrate, the wiring layer including circuit traces and pads, and orthographic projections of the circuit traces and the pads on the transparent substrate being all located within an orthographic projection of the first metal light-shielding layer on the transparent substrate; and
   light-emitting devices, disposed on a side of the wiring layer away from the transparent substrate, and electrically connected to some of the pads, orthographic projections of the light-emitting devices on the transparent substrate being located within the orthographic projection of the first metal light-shielding layer on the transparent substrate.

2. The light-emitting substrate according to claim 1, further comprising:
   a second metal light-shielding layer disposed between the first metal light-shielding layer and the wiring layer, wherein
   the second metal light-shielding layer and the first metal light-shielding layer are configured in such way that at least part of ambient light reflected by a surface of the second metal light-shielding layer proximate to the transparent substrate and at least part of the ambient light reflected by a surface of the first metal light-shielding layer proximate to the transparent substrate are capable of interfering destructively with each other.

3. The light-emitting substrate according to claim 2, wherein a thickness of the second metal light-shielding layer is in a range of 100 angstroms to 500 angstroms, inclusive; and/or
   a material of the second metal light-shielding layer includes molybdenum oxide and/or molybdenum niobium oxide.

4. The light-emitting substrate according to claim 1, wherein a thickness of the first metal light-shielding layer is in a range of 400 angstroms to 500 angstroms, inclusive; and/or
   a material of the first metal light-shielding layer includes molybdenum oxide and/or molybdenum niobium oxide.

5. The light-emitting substrate according to claim 1, wherein a distance between a border of the orthographic projection of the first metal light-shielding layer on the transparent substrate and a border, at a same side, of an orthographic projection of a light-emitting device of the light-emitting devices on the transparent substrate is greater than or equal to $W_1$, and
   $W_1$ is equal to $H_1$ times $\tan\theta$ ($W_1 = H_1 \times \tan\theta$);
   wherein $H_1$ is a maximum perpendicular distance between a surface of the light-emitting device away from the transparent substrate and a surface of the transparent substrate away from the light-emitting device; and $\theta$ is a total reflection angle of the surface of the transparent substrate away from the light-emitting device.

6. The light-emitting substrate according to claim 1, wherein the orthographic projections of the light-emitting devices on the transparent substrate each are a first projection pattern; the first metal light-shielding layer includes set light-shielding patterns each for shielding a light-emitting device of the light-emitting devices, and an orthographic projection of the set light-shielding pattern on the transparent substrate is a second projection pattern;
   a distance between a border of the first projection pattern and a border of the second projection pattern at a same side is greater than or equal to $W_2$, and
   $W_2$ is equal to $H_2$ times $\tan\theta$ ($W_2 = H_2 \times \tan\theta$);
   wherein the border of the first projection pattern is a first border, and the border of the second projection pattern at the same side is a second border; $H_2$ is a maximum perpendicular distance between a side edge, corresponding to the first border, of a surface of the light-emitting device away from the transparent substrate and a surface of the transparent substrate away from the light-emitting device; and $\theta$ is a total reflection angle of the surface of the transparent substrate away from the light-emitting device.

7. The light-emitting substrate according to claim 1, wherein a distance between a border of the orthographic projection of the first metal light-shielding layer on the transparent substrate and a border, at a same side, of an orthographic projection of a light-emitting device of the light-emitting devices on the transparent substrate is greater than or equal to 4.2 μm; and/or
   a distance between a border of an orthographic projection of a circuit trace of the circuit traces on the transparent substrate and the border, at the same side, of the orthographic projection of the first metal light-shielding layer on the transparent substrate is greater than or equal to 0.5 μm.

8. The light-emitting substrate according to claim 1, wherein the wiring layer further includes:
   a support layer including a plurality of support patterns, wherein each of the support patterns includes two support portions; each of the support portions has a first side surface, the first side surface is a side surface in a direction in which the support portions are arranged, and the first side surface is obliquely disposed relative to a reference surface; the reference surface is a plane where a surface of the transparent substrate away from the light-emitting devices is located, wherein
   the some of the pads in the wiring layer includes anode pads and cathode pads, the light-emitting devices each include an anode pin and a cathode pin, the anode pin is electrically connected with an anode pad of the anode pads, the cathode pin is electrically connected with a cathode pad of the cathode pads, and the anode pad and the cathode pad are respectively located on first side surfaces of two support portions of a corresponding support pattern.

9. The light-emitting substrate according to claim 8, wherein the support portions each have a shape of a pyramid, and/or
   the first side surfaces of the two support portions are substantially parallel, and/or
   thicknesses of the two support portions are substantially equal.

10. The light-emitting substrate according to claim 8, wherein the light-emitting devices each further include a light-emitting portion, and the anode pin and the cathode pin are located on a same side of the light-emitting portion; in a thickness direction of the light-emitting portion, a thickness of the anode pin is greater than a thickness of the cathode pin; and an end surface of the anode pin away from the light-emitting portion is in surface contact with the anode pad, and an end surface of the cathode pin away from the light-emitting portion is in surface contact with the cathode pad.

11. The light-emitting substrate according to claim 10, wherein a surface of the light-emitting portion away from the anode pin and the cathode pin is obliquely disposed relative to the reference surface.

12. The light-emitting substrate according to claim 8, wherein an angle included between the first side surface and the reference surface is α, and $$\alpha = \arctan(L/S);$$

wherein L is a difference between a thickness of the anode pin and a thickness of the cathode pin; and S is a dimension of the cathode pin in a first direction, and the first direction is a direction from the anode pin to the cathode pin; and/or
an angle included between the first side surface and the reference surface is in a range of 8 degrees to 12 degrees, inclusive.

13. The light-emitting substrate according to claim 8, wherein the circuit traces include signal lines and transfer lines, and the wiring layer further includes:
a first conductive layer disposed between the support layer and the transparent substrate, the signal lines being located in the first conductive layer;
a first passivation layer disposed between the first conductive layer and the support layer;
a second conductive layer disposed on a side of the support layer away from the transparent substrate, the transfer lines and the pads being located in the second conductive layer; and
a second passivation layer disposed on a side of the second conductive layer away from the transparent substrate, wherein the second passivation layer has a plurality of openings; and the second conductive layer has a portion located on the first side surface of the support portion, at least part of the portion is exposed by an opening of the plurality of openings, and the at least part of the portion serves as a pad of the pads.

14. The light-emitting substrate according to claim 13, wherein the wiring layer further includes:
a third passivation layer disposed between the second conductive layer and the support layer; and
a fourth passivation layer disposed between the first conductive layer and the first metal light-shielding layer.

15. The light-emitting substrate according to claim 1, further comprising:
fixing components disposed on a side of the pads away from the transparent substrate, the fixing components being configured to connect pins of the light-emitting devices with the some of the pads.

16. A method for manufacturing a light-emitting substrate, the method comprising:
forming a first metal light-shielding layer on a transparent substrate;
forming a wiring layer on a side of the first metal light-shielding layer away from the transparent substrate, wherein the wiring layer includes circuit traces and pads, and orthographic projections of the circuit traces and the pads on the transparent substrate are all located within an orthographic projection of the first metal light-shielding layer on the transparent substrate; and
arranging light-emitting devices on a side of the wiring layer away from the transparent substrate, wherein the light-emitting devices are electrically connected to some of the pads; and orthographic projections of the light-emitting devices on the transparent substrate are located within the orthographic projection of the first metal light-shielding layer on the transparent substrate.

17. The manufacturing method according to claim 16, between forming the first metal light-shielding layer on the transparent substrate and forming the wiring layer on the side of the first metal light-shielding layer away from the transparent substrate, further comprising:
forming a second metal light-shielding layer on the side of the first metal light-shielding layer away from the transparent substrate, wherein the second metal light-shielding layer and the first metal light-shielding layer are configured in such way that at least part of ambient light reflected by a surface of the second metal light-shielding layer proximate to the transparent substrate and at least part of the ambient light reflected by a surface of the first metal light-shielding layer proximate to the transparent substrate are capable of interfering destructively with each other.

18. The manufacturing method according to claim 16, wherein the circuit traces include signal lines and transfer lines, and forming the wiring layer on the side of the first metal light-shielding layer away from the transparent substrate includes:
forming a first conductive layer on the side of the first metal light-shielding layer away from the transparent substrate, the signal lines being located in the first conductive layer;
forming a first passivation layer on a side of the first conductive layer away from the transparent substrate;
forming a support layer on a side of the first passivation layer away from the transparent substrate, wherein the support layer includes a plurality of support patterns; each of the plurality of support patterns includes two support portions, each of the support portions has a first side surface, and the first side surface is obliquely disposed relative to a reference surface; the reference surface is a plane where a surface of the transparent substrate away from the light-emitting devices is located; and
forming a second conductive layer on a side of the support layer away from the transparent substrate, the transfer lines and the pads being located in the second conductive layer.

19. The manufacturing method according to claim 18, wherein forming the support layer on the side of the first passivation layer away from the transparent substrate includes:
forming a support film on the side of the first passivation layer away from the transparent substrate;
patterning the support film to obtain a plurality of initial support patterns, wherein each of the initial support patterns includes two initial support portions, each of the initial support portions has an initial first side surface, and the initial first side surface is a side surface in a direction in which the two initial support portions are arranged;
performing a mask exposure and a development on the initial support portion multiple times to form a multi-stage step in the initial first side surface of the initial support portion; and heating and curing the initial support portion to form the support portion, the initial first side surface forming the first side surface of the support portion; and/or arranging the light-emitting devices on the side of the wiring layer away from the transparent substrate includes:

forming a resin layer on the pads;

placing pins of the light-emitting devices on the resin layer;

heating the resin layer to melt the resin layer; and curing the resin layer after the pins of the light-emitting devices are electrically connected to the some of the pads.

20. A display apparatus, comprising:

a display panel having a light-exit side and a non-light-exit side which are opposite to each other, the display panel including a reflective layer disposed on the non-light-exit side, the reflective layer capable of reflecting light from the light-exit side; and the light-emitting substrate according to claim 1, disposed on the light-exit side of the display panel.

\* \* \* \* \*